US009172570B1

(12) United States Patent
Li Puma

(10) Patent No.: US 9,172,570 B1
(45) Date of Patent: Oct. 27, 2015

(54) COMPENSATION OF OSCILLATOR FREQUENCY PULLING

(71) Applicant: Intel IP Corporation, Santa Clara, CA (US)

(72) Inventor: Giuseppe Li Puma, Bochum (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/303,821

(22) Filed: Jun. 13, 2014

(51) Int. Cl.
*H04L 25/49* (2006.01)
*H04L 27/04* (2006.01)
*H04L 27/12* (2006.01)

(52) U.S. Cl.
CPC ............... *H04L 27/04* (2013.01); *H04L 27/12* (2013.01)

(58) Field of Classification Search
CPC . H03L 2207/50; H04L 27/368; H04L 27/367; H04L 27/3863; H04L 27/3872; H03F 1/3241; H03F 1/3247; H03F 2200/324
USPC .......... 375/284–285, 295–298, 300, 358, 376
See application file for complete search history.

(56) References Cited

U.S. PATENT DOCUMENTS

| 6,101,224 | A | 8/2000 | Lindoff et al. | |
|---|---|---|---|---|
| 6,566,944 | B1 | 5/2003 | Pehike et al. | |
| 6,834,084 | B2* | 12/2004 | Hietala | 375/296 |
| 7,020,070 | B2 | 3/2006 | Lindoff | |
| 7,109,816 | B2* | 9/2006 | Khlat | 332/112 |
| 7,181,205 | B1* | 2/2007 | Scott et al. | 455/423 |
| 7,346,122 | B1* | 3/2008 | Cao | 375/296 |
| 7,570,925 | B2* | 8/2009 | Dunworth et al. | 455/76 |
| 7,599,418 | B2 | 10/2009 | Ahmed | |
| 7,808,325 | B2* | 10/2010 | Waheed et al. | 331/1 A |
| 7,817,970 | B2* | 10/2010 | Puma | 455/114.3 |
| 7,929,637 | B2 | 4/2011 | Staszewski et al. | |
| 7,962,108 | B1* | 6/2011 | Khlat et al. | 455/114.3 |
| 7,991,071 | B2 | 8/2011 | Hietala | |
| 8,009,756 | B2 | 8/2011 | Ishikawa et al. | |
| 8,130,865 | B2 | 3/2012 | Schimper et al. | |
| 8,170,507 | B2* | 5/2012 | Wang et al. | 455/114.3 |
| 8,233,854 | B2* | 7/2012 | Li Puma et al. | 455/118 |
| 8,315,559 | B2* | 11/2012 | Chen et al. | 455/24 |
| 8,494,085 | B2* | 7/2013 | Plevridis | 375/297 |
| 8,583,060 | B2* | 11/2013 | Li Puma et al. | 455/108 |
| 8,638,878 | B2* | 1/2014 | Li Puma et al. | 375/296 |
| 8,660,209 | B2* | 2/2014 | Kao et al. | 375/300 |
| 8,798,194 | B2* | 8/2014 | Jechoux et al. | 375/296 |
| 8,867,660 | B2* | 10/2014 | Jechoux et al. | 375/296 |

(Continued)

OTHER PUBLICATIONS

U.S. Appl. No. 13/326,712, filed Dec. 15, 2011.

(Continued)

*Primary Examiner* — Emmanuel Bayard
(74) *Attorney, Agent, or Firm* — Eschweiler & Associates, LLC

(57) ABSTRACT

A transmitter includes an amplitude modulation path, and a frequency modulation path including a phase locked loop (PLL) having a controllable oscillator and a phase detector. The transmitter further includes an amplitude to frequency distortion compensation unit configured to generate a compensation signal based on amplitude data from the amplitude modulation path, error data based on an output of the phase detector, and data reflecting a transfer function from the controllable oscillator to the output of the phase detector, and is further configured to provide the compensation signal to a node in a feedforward path of the PLL.

21 Claims, 19 Drawing Sheets

(56) References Cited

U.S. PATENT DOCUMENTS

| | | | |
|---|---|---|---|
| 8,923,461 B2* | 12/2014 | Li Puma et al. | 375/350 |
| 8,942,315 B1* | 1/2015 | Wang et al. | 375/306 |
| 8,947,172 B2* | 2/2015 | Wang et al. | 332/128 |
| 2004/0208157 A1* | 10/2004 | Sander et al. | 370/345 |
| 2005/0129140 A1 | 6/2005 | Robinson | |
| 2007/0189431 A1* | 8/2007 | Waheed et al. | 375/376 |
| 2008/0205571 A1* | 8/2008 | Muhammad et al. | 375/376 |
| 2008/0317169 A1* | 12/2008 | Boos et al. | 375/300 |
| 2009/0207940 A1 | 8/2009 | Staszewski et al. | |
| 2010/0246714 A1 | 9/2010 | Yang et al. | |
| 2012/0263256 A1* | 10/2012 | Waheed et al. | 375/296 |

OTHER PUBLICATIONS

U.S. Appl. No. 13/326,679, filed Dec. 15, 2011.
Notice of Allowance Dated May 30, 2014 U.S. Appl. No. 13/326,679.
Non-Final Office Action dated Nov. 7, 2013 for U.S. Appl. No. 13/326,679.
Office Action Dated Apr. 8, 2014 U.S. Appl. No. 13/326,679.
U.S. Appl. No. 13/326,749, filed Dec. 15, 2011.
Office Action Dated Dec. 19, 2013 U.S. Appl. No. 13/326,749.
Notice of Allowance Dated Apr. 11, 2014 U.S. Appl. No. 13/326,749.

* cited by examiner

EDR PACKET STRUCTURE

COMPENSATION OF OSCILLATOR FREQUENCY PULLING

BACKGROUND

Power efficiency for transceiver architectures has become an important issue for portable handheld devices. Next generation wireless communication systems, Bluetooth, WLAN, GSM-EDGE, and the like, employ non-constant envelope modulation schemes in order to achieve high data-rates. Traditional designs of RF-modulator concepts employ vector modulator architectures which operate essentially as a single-sideband up-converter (SSB) using two digital-to-analog converters (DAC), two mixers and a linear power amplifier (PA). However, these architectures are power inefficient because they require a complete linear signal path. Further, the vector modulator concept sometimes requires a separation of the transceiver and the power amplifier on the mobile printed circuit board (PCB) in order to avoid parasitic coupling of the output signal into the VCO. Therefore the vector modulator transmitter approach has been replaced in some architectures by the polar modulator concept.

The polar modulator concept separates the modulation signal into an amplitude modulation (AM) signal and a phase modulation (PM) signal. The symbols or points used in polar modulation correspond or translate from Cartesian coordinates utilized in vector modulation concepts. The polar modulation concept provides power efficiency advantages, among others.

DETAILED DESCRIPTION

The present disclosure includes systems and methods that estimate distortions to a phase modulation signal and provide a correction signal based on the estimate to correct or mitigate distortions of the phase modulation signal. The distortions include those resulting from amplitude modulation to frequency modulation effects. In one example the estimated distortions are at least partially calculated during an initial portion of a communication sequence. Then, the estimated distortions are used with one or more other inputs to generate the correction signal.

Figure 1A:
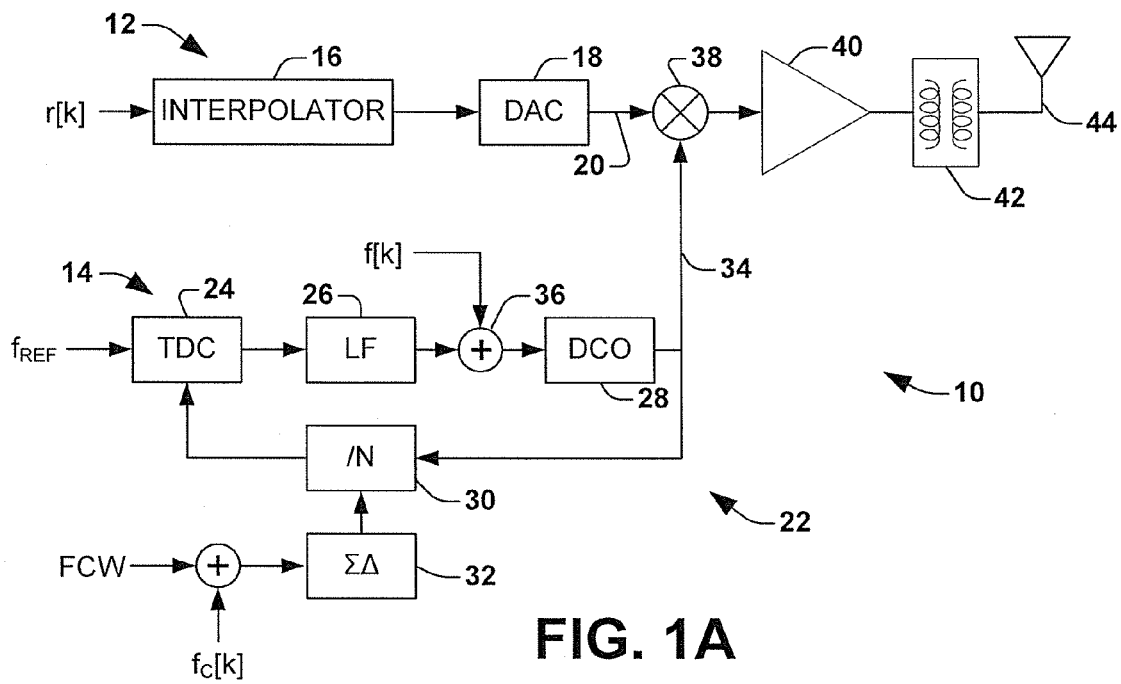
FIG. 1A is a block diagram illustrating a transmitter employing a polar modulator architecture.

In portable devices, it is typically advantageous to improve the integration of functions together onto a single chip in order to reduce the size and power consumption of such functions. For example, it is desirable to be able to integrate radio frequency (RF) circuitry onto the same chip as the digital baseband processor. FIG. 1A illustrates a modulator type structure 10 that employs a polar type architecture, wherein baseband data in Cartesian coordinates (not shown) having in-phase (I) and quadrature (Q) components are converted into equivalent polar form having an amplitude (r) and phase (φ) components, respectively.

The polar modulator 10 has an amplitude modulation path 12 and a phase modulation path 14. Digital, discrete amplitude data r[k] is interpolated via an interpolator 16 and converted into analog form via a digital to analog converter (DAVC) 18 to form interpolated analog amplitude data 20. The phase modulation path 14 includes a digital phase lock loop (DPLL) 22 having a feedforward path that includes a time to digital converter (TDC) 24, a loop filter 26 and a digitally controlled oscillator (DCO) 28. The DPLL 22 also includes a feedback loop having a programmable divider 30 that is driven by a sigma-delta modulator 32, for example, fed by a frequency control word (FCW). The carrier frequency of the modulator 10 is dictated by the frequency control word (FCW) such that the desired channel is selected. In response to changes in the frequency control word (FCW), the carrier frequency 34 output from the DCO 28 is altered. The phase modulation data is modulated onto the carrier signal 34 in the feedforward path at a node 36 wherein the digital, discrete frequency or phase data f[k] is injected, and in the feedback path where modulation data $f_c$[k] is added to the frequency control word FCW. This type of architecture is sometimes referred to as a two-point modulator architecture, since modulation data is inserted into the modulator at two locations. Thus the carrier signal 34 is actually a frequency modulated carrier signal. The frequency modulated carrier signal 34 is then mixed with the interpolated analog amplitude data 20 at mixer 38, amplified at components 40, 42, and transmitted via an antenna 44.

Figure 1B:
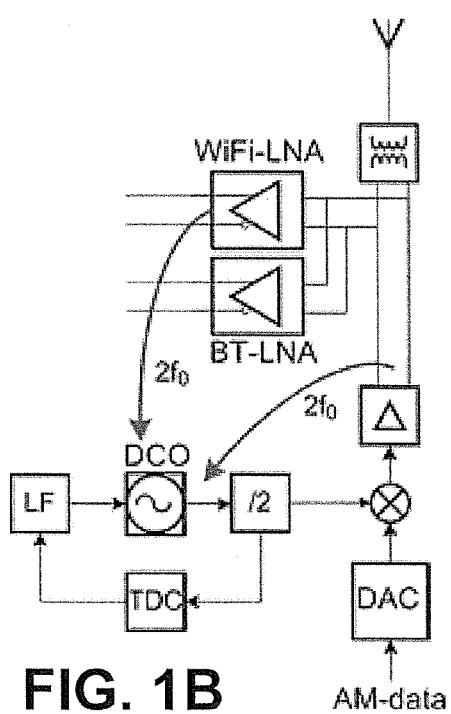
FIG. 1B is a block diagram illustrating parasitic coupling related to a second harmonic of a power amplifier into a DCO, resulting in distortion.

The inventor of the present disclosure appreciated that in an architecture (which is not asserted to be publicly known) such as that illustrated in FIG. 1A, wherein the DCO 28 is operated at twice the channel frequency, parasitic coupling of the second harmonic of the power amplifier output signal back into the DCO results in unwanted frequency modulation in the DPLL 22. Such parasitic coupling is illustrated, for example, in FIG. 1B. The present disclosure addresses this heretofore unrecognized problem by providing for a digital compensation signal that is employed as predistortion in the feedforward path of the DPLL 22 to account for the amplitude to frequency distortion caused by the unwanted parasitic coupling.

Figure 2A:
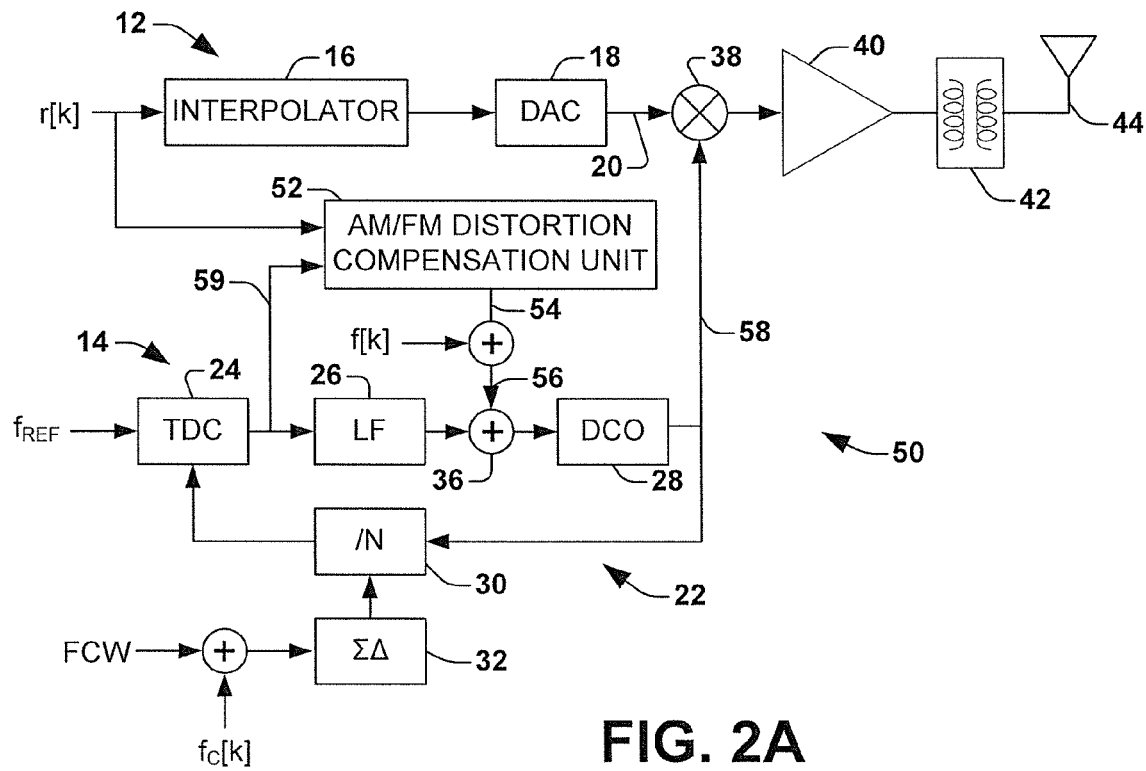
FIG. 2A is a block diagram illustrating a transmitter employing a polar modulator architecture having a distortion compensation unit in conjunction with a digital phase locked loop (DPLL).
Figure 2B:
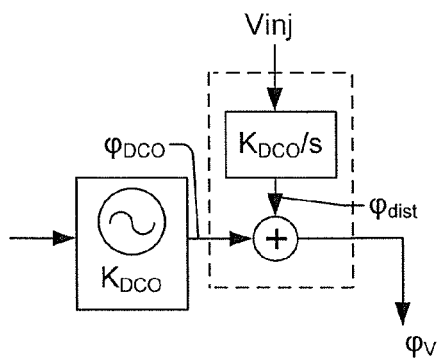
FIG. 2B is a block diagram illustrating frequency distortion injected into the DCO due to parasitic coupling.

FIG. 2A is directed to a transmitter 50 in accordance with one example of the disclosure. The transmitter 50, in one example, has similar components to that described in FIG. 1A and to the extent that such components are similar and operate in a manner similar to that in FIG. 2A, such components will not be described again for purposed of simplicity. The transmitter 50 further includes an amplitude to frequency (AM/FM) distortion compensation unit 52 that operates to compensate for the undesired frequency distortion effects described above with respect to FIGS. 1A and 1B due to the parasitic coupling. In one example, the AM/FM distortion compensation unit 52 generates and outputs a compensation signal 54 that is added to the frequency modulation data f[k] to effectively predistort the frequency modulation data such that predistorted frequency modulation data 56 is injected into the feedforward path of the DPLL 22. Effectively, the compensation signal cancels (or substantially cancels) the frequency distortion experienced by the DCO $f_{dist}$[k]. The frequency distortion that is injected into the transmitter at the DCO (a controllable oscillator) is illustrated or modeled, for example, in FIG. 2B. Consequently, the resultant frequency modulated carrier signal 58 output from the DCO 28 (and which the present disclosure compensates for) is predistorted to account for the thus mitigate the effects of the parasitic coupling that still occurs due to the power amplifier output signal.

In one example, the AM/FM distortion compensation unit 52 generates the compensation signal based on the amplitude data r[k] from the amplitude modulation path 12 and error data 59 output from the TDC 24 (a phase detector), as well as data that reflects a transfer function from the DCO 28 to the TDC 24, and from the TDC output to the input of the compensation unit 52. In one example such data is employed in conjunction with an adaptive filter to generate one or more compensation coefficients for a compensation polynomial signal that operates to cancel the induced frequency distortion.

Figure 3A:
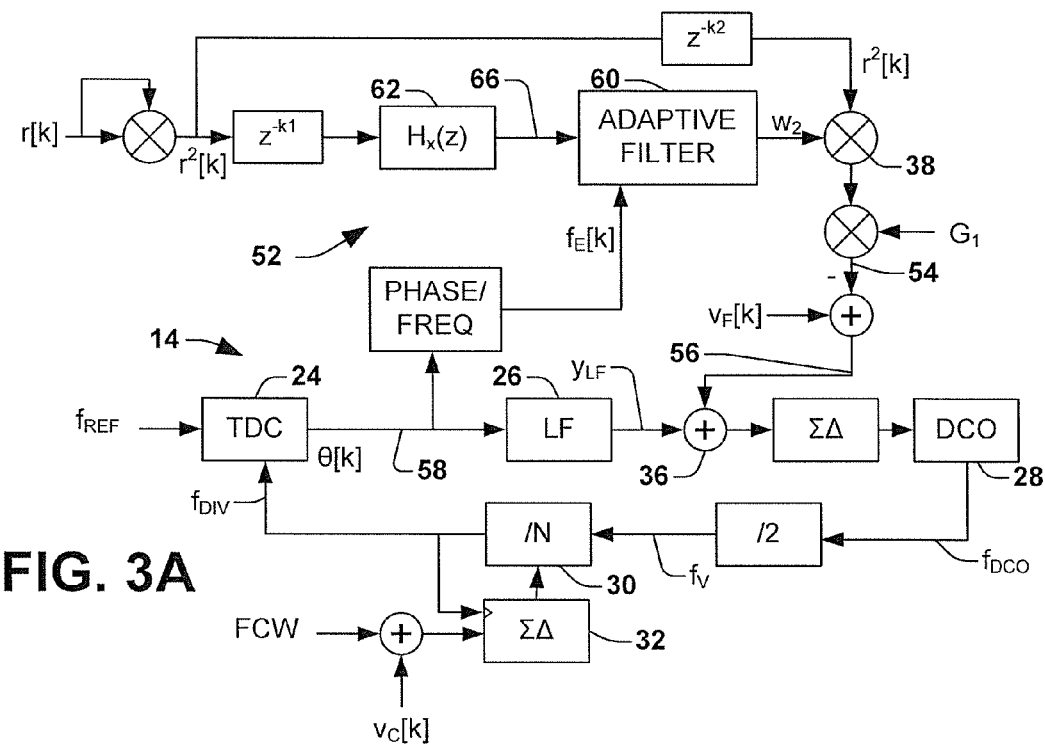
FIG. 3A is block diagram illustrating a transmitter employing a polar modulator architecture, wherein a distortion compensation unit employs an adaptive filter to generate a compensation signal.

FIG. 3A is a schematic diagram illustrating the AM/FM distortion compensation unit 52 according to one example of the present disclosure. The compensation unit 52 comprises an adaptive filter 60 that receives an amplitude data r[k], or in this particular example, processed amplitude data $r^2$[k], that has been filtered by a compensation filter 62 that filters the amplitude data that characterizes the cascaded transfer function (TF) from the injection point of the compensation signal, namely the DCO 28 to the TDC 24 in the feedback path of the DPLL 22 and from the TDC output to the input of the adaptive filter 60. The output of the compensation filter 62 is thus filtered amplitude data 66. The adaptive filter 60 further receives error data 68 that represents or is related to the phase error between a reference signal $f_{REF}$ and a feedback signal $f_{DIV}$ in the feedback path of the DPLL 22. The adaptive filter 60 thus employs the amplitude data that is conditioned by the same transfer function as the distortion signal measured at the TDC output and the error data in generating the coefficient(s) for forming the compensation signal 54. In one example, if the DCO 28 is operated at 2× the transmit frequency or carrier frequency, then the compensation coefficient is a second order coefficient $w_2 r^2$. Alternatively, if the DCO 28 is operated at 4× the transmit frequency, then the compensation coefficient is a fourth order coefficient $w_4 r^4$.

It is understood that in light of the above information, numerous algorithms and techniques may be employed in the digital domain to use the above information to generate the compensation signal, and all such examples are contemplated as falling within the scope of the present disclosure. In one example, the adaptive filter 60 is configured to generate one or more compensation coefficients that substantially cancel the frequency distortion by minimizing an error between the distortion and the compensation signal. In one non-limiting example of a second order correction, one type of cost function J may be:

$$J = e^2[k] = (f_{dist}[k] - f_{corr}[k])^2 \qquad \text{Eq. 1}$$

where $f_{corr} = G_1 \cdot w_2 \cdot r^2$ is the frequency correction signal which is also denoted as the compensation signal $f_{comp}$. The factor $G_1$ is the oscillator normalization factor, i.e. $G_1 = \text{fref}//K_{DCO}$, $K_{DCO}$ is the actual DCO gain which is assumed to be known. The polynomial equation for which polynomial coefficients $w = \{w_2\}$ are to be determined is thus, $$e^2[k] = (f_{dist} - G_1 w_2 r[k]^2)^2 \qquad \text{Eq. 2}$$

More generally, we could establish a polynomial of order N for which polynomial coefficients $w = \{w_1, w_2, \ldots, w_N\}$ are to be determined as.

$$e^2[k] = (f_{dist} - G_1(w_1 r[k] + w_2 r[k]^2 \ldots + w_N r[k]^N))^2 \qquad \text{Eq. 2b}$$

Figure 3B:
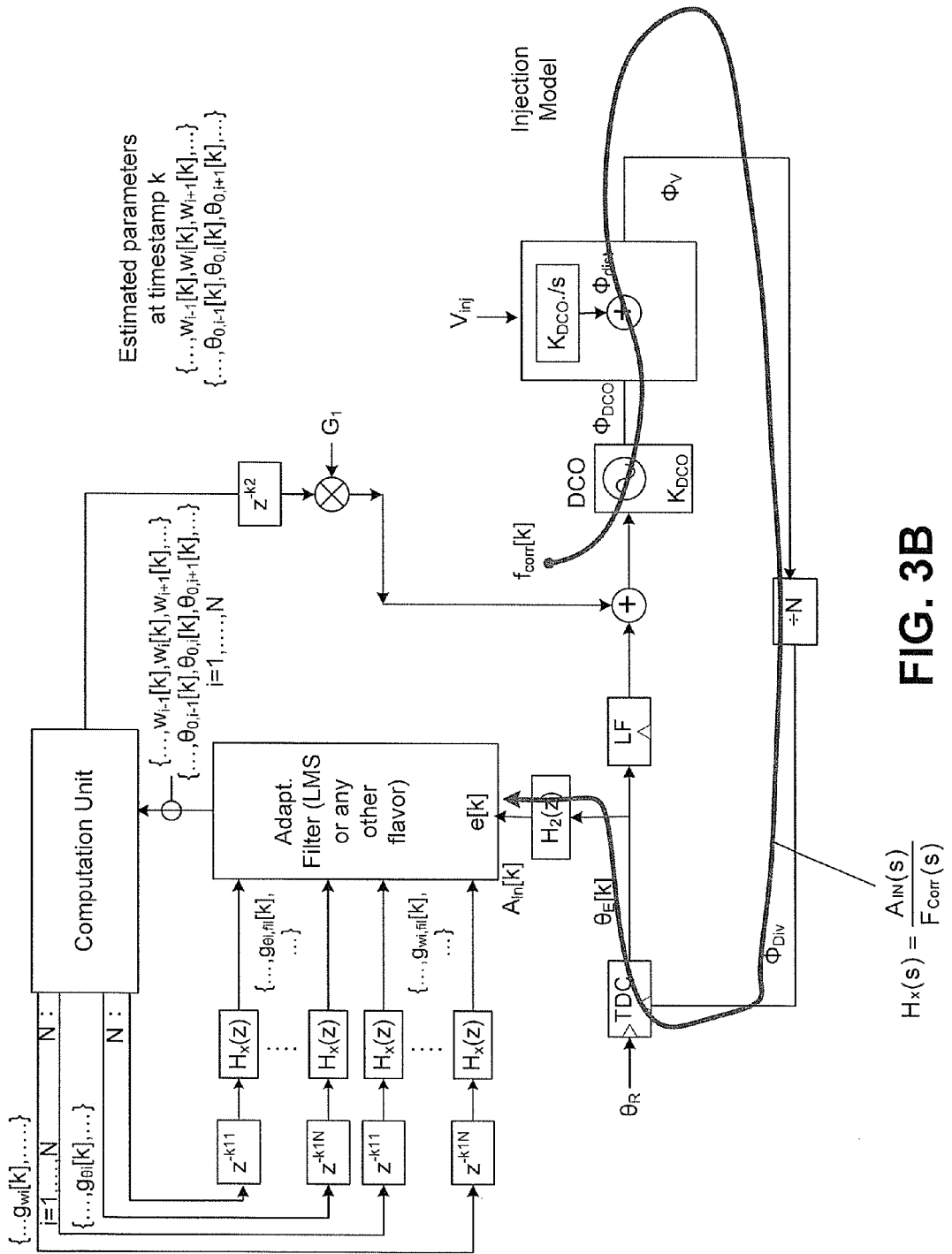
FIGS. 3B-3C are block diagrams illustrating transfer functions associated with a DCO that are contemplated in providing distortion compensation according to various examples of the disclosure.

It is noted that $f_{dist}$[k] is not directly observable without employing other means and consequently the difference $e[k] = f_{dist}[k] - f_{corr}[k]$ is not detectable as well. In other words, one can only observe phase/frequency quantities that are subject to the DPLL filtering. The observable quantity is the output of TDC 24, also commonly called a phase detector, which is $\theta_E[k]$ or converted to a frequency $f_E[t] = d\theta_E(t)/dt$ that is the derivate of the phase respect to time. In a discrete time implementation we can approximate the differential operator by the difference operator, hence $$f_E[k] = \Delta\theta_E[k]/\Delta T[k] = (\theta_E[k] - \theta_E[k-1]) \cdot f_s \qquad \text{Eq. 3}$$

where k is the index for the timestamps $kT_s$ and $\Delta T$[k] is the difference between consecutive timestamps and $f_s$ is the sampling frequency. In the absence of the correction signal $f_{corr}$[t], the frequency error obtained from the TDC output $\theta_E$[k], corresponds to $f_E[t] = f_{dist}[t] * h_v[k]$ where $h_v$[k] is the response from the injection point of the distortion to the TDC output frequency which will be further described below. In other words, $f_{dist}[t] * h_v[k]$ is a highpass or bandpass filtered version of the frequency distortion induced at the DCO 28. The feedback action of the DPLL will perceive the detected frequency distortion as an error and hence the control loop will slowly compensate for this disturbance. Therefore, it is advantageous that this DPLL response which is described by the transfer function $H_v(s)$ is taken into account of in order to achieve sufficient estimation accuracy, as illustrated in FIG. 3B. Otherwise the adaptive filter estimation will not be able to determine the optimal coefficients to cancel the distortion signal properly.

In general the transfer function $H_v(s)=A_{In}(s)/V_{inj}(s)$ is given by:

$$H_V(s) = \frac{A_{In}(s)}{V_{Inj}(s)} = \underbrace{\frac{\Theta_E(s)}{V_{Inj}(s)}}_{=H_1(s)} \cdot \underbrace{\frac{A_{In}(s)}{\Theta_E(s)}}_{=H_2(s)} = \underbrace{\frac{K_{DCO^*}/s}{\left(1 + \frac{K_{DCO}}{s} \cdot H_{LF}(s)\right)}}_{H_1(s)} \cdot H_2(s) \qquad \text{Eq. 4}$$

Figure 3C:
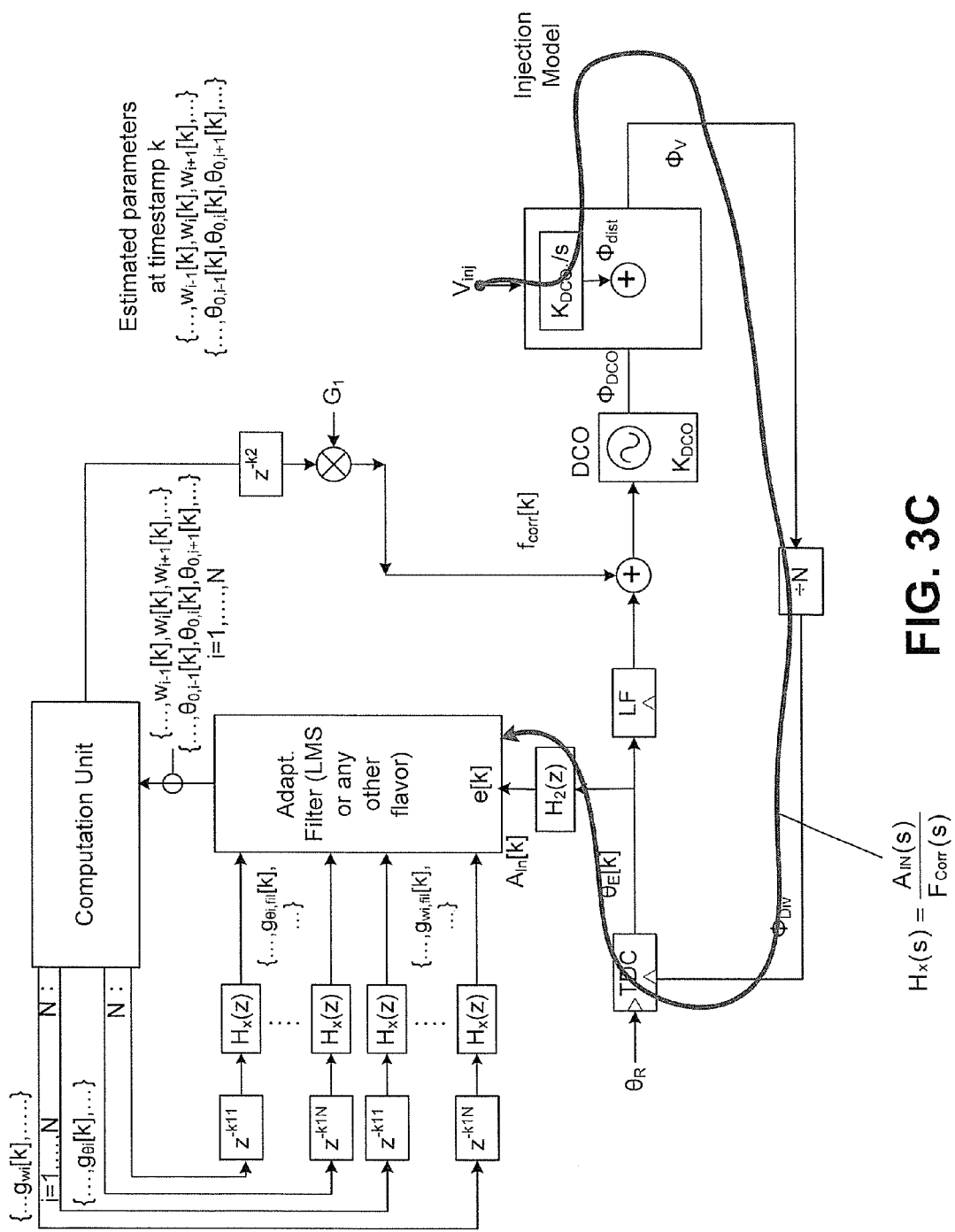

$H_1(s)=\Theta_E(s)/V_{inj}(s)$ is the closed-loop PLL response and $H_2(s)$ could be the cascaded transfer function of the phase-to-frequency conversion given by $H_{\theta/f}(z)=(1-z^{-1})$ and an optional low-pass filter $H_w(s)$ to filter the quantization error. In the presence of the correction signal $f_{corr}[t]$, the frequency error signal at the TDC output corresponds to $f_E[t]=f_{dist}[t]*h_v[k]-f_{corr}[t]*h_x[k]$, where $h_x[k]$ is the response from the injection point of the correction signal to the TDC output, as illustrated in FIG. 3C. The error quantity $f_E[t]$ corresponds to the error term $e[k]$ which we would like to minimize by means of adaptive filter algorithms such as least-squares, least mean squares or any other flavor.

Hence, we can rewrite the cost function J $$J=e^2[k]=(f_{dist}[k]*h_v[k]-f_{corr}[k]*h_x[k])^2, \qquad \text{Eq. 5}$$

which represents the mathematical foundation of the underlying adaptive frequency compensation method according to one example.

Note, that we could have chosen also other cost functions rather than squared error. For instance, we could have chosen to minimize the cost function as the absolute error argmin($J=|e|$) or the fourth power argmin($J=e^4$) or any other convenient function. The advantage of choosing the squared error is the fact that it can be handled mathematically much easier. Therefore, without limiting the generality, we treat the case of minimization of the squared error argmin($J=e^2$).

As stated above, in FIG. 3A, the adaptive filter 60 receives filtered amplitude data 66 that has been filtered by the compensation filter $H_x(z)$ 62. Thus in acknowledging the cascaded transfer function effect from the DCO 28 to the TDC 24 and the TDC output to the input of the adaptive filter on the frequency error perceived by the frequency distortion signal, the cost function can be rewritten in one example as:

$$J(w_2)=e^2[k]=(f_{dist}[k]*h_v[k]-G_1w_2r^2[k]*h_x[k])^2, \qquad \text{Eq. 6}$$

wherein "*" represents a convolution operation, and $h_v$ is the impulse response of $H_v(z)$ from the DCO injection point $V_{Inj}$ to the input of the adaptive filter 60 (i.e., the cascaded transfer function from the DCO injection point to the output of the TDC, and from the TDC output to the input of the adaptive filter, in one example) which is perceived by the distortion signal. In addition, $h_x$ is the impulse response of $H_x(z)$ from the input of the DCO injection point of the correction to the input of the adaptive filter 60 (i.e., the cascaded transfer function from the DCO injection point to the output of the TDC, and from the TDC output to the input of the adaptive filter, in one example). In another example we could also replace the TDC by a general phase or phase-frequency detector. Note, that $H_v(z)$ and $H_x(z)$ are substantially the same except for a constant factor and delay. The constant factor will be estimated by the adaptive filter 60. The delay can also be accounted for by delay stages.

As an example:

$$H_V(s) = \frac{A_{In}(s)}{V_{Inj}(s)} = \frac{K_{DCO^*}}{\left(1 + \frac{K_{DCO}}{s} \cdot H_{LF}(s)\right)} \cdot H_w(s). \qquad \text{Eq. 7}$$

where $K_{DCO^*}$ is the unknown DCO gain seen by the distortion signal and $H_w(s)$ is an optional lowpass filter to filter the high frequency quantization noise at the output of the TDC 24 and the input $A_{In}$ of the adaptive filter 60. The transfer function $H_{LF}(s)$ is the loop-filter transfer function which for a type-I PLL simplifies to a constant $k_p$.

Accordingly, the transfer function $H_x(s)$ is given as $$H_X(s) = \frac{A_{In}(s)}{F_{Corr}(s)} = \frac{\Theta_E(s)}{F_{Corr}(s)} \cdot \frac{A_{In}(s)}{\Theta_E(s)} = \frac{K_{DCO}}{\left(1 + \frac{K_{DCO}}{s} \cdot H_{LF}(s)\right)} \cdot H_w(s). \qquad \text{Eq. 8}$$

Hence, in order to perform the comparison appropriately, the correction signal $f_{corr}$ undergoes the same transfer function (or at least a similar transfer function or any approximation of the transfer function) as the distortion signal $f_{dist}$. Note, that the error signal $e[k]$ corresponds in FIG. 5 to the signal 110.

Acknowledging that the phase is the integral of the frequency, in one alternative example the comparison can be performed on phase domain quantities. In this case the cost function can be written as $$e_\phi^2[k]=(\phi_{dist}[k]*h_{v,\phi}[k]-\phi_{corr}[k]*h_{x,\phi}[k])^2 \qquad \text{Eq. 9}$$

The index $\phi$ emphasizes that the input of the adaptive filter is fed with a phase signal. However, in most cases we will omit the index $\phi$ for ease of notation, since phase and frequency are linked by the derivative or the integral with respect to time.

$$e_\phi^2=(\phi_{dist}*\tilde{h}_v-\phi_{corr}*\tilde{h}_x)^2 \qquad \text{Eq. 10}$$

which yields for the example of quadratic correction the cost function $$e_\phi^2=(\phi_{dist}*\tilde{h}_v-G_1w_2\int r(t)^2 dt*h_x)^2 \qquad \text{Eq. 11}$$

Note, that the conversion from phase-to-frequency or frequency-to-phase which is an integration or differentiation, can be easily absorbed in the transfer functions $H_x(s)$ and $H_v(s)$, in one example.

Figure 12:
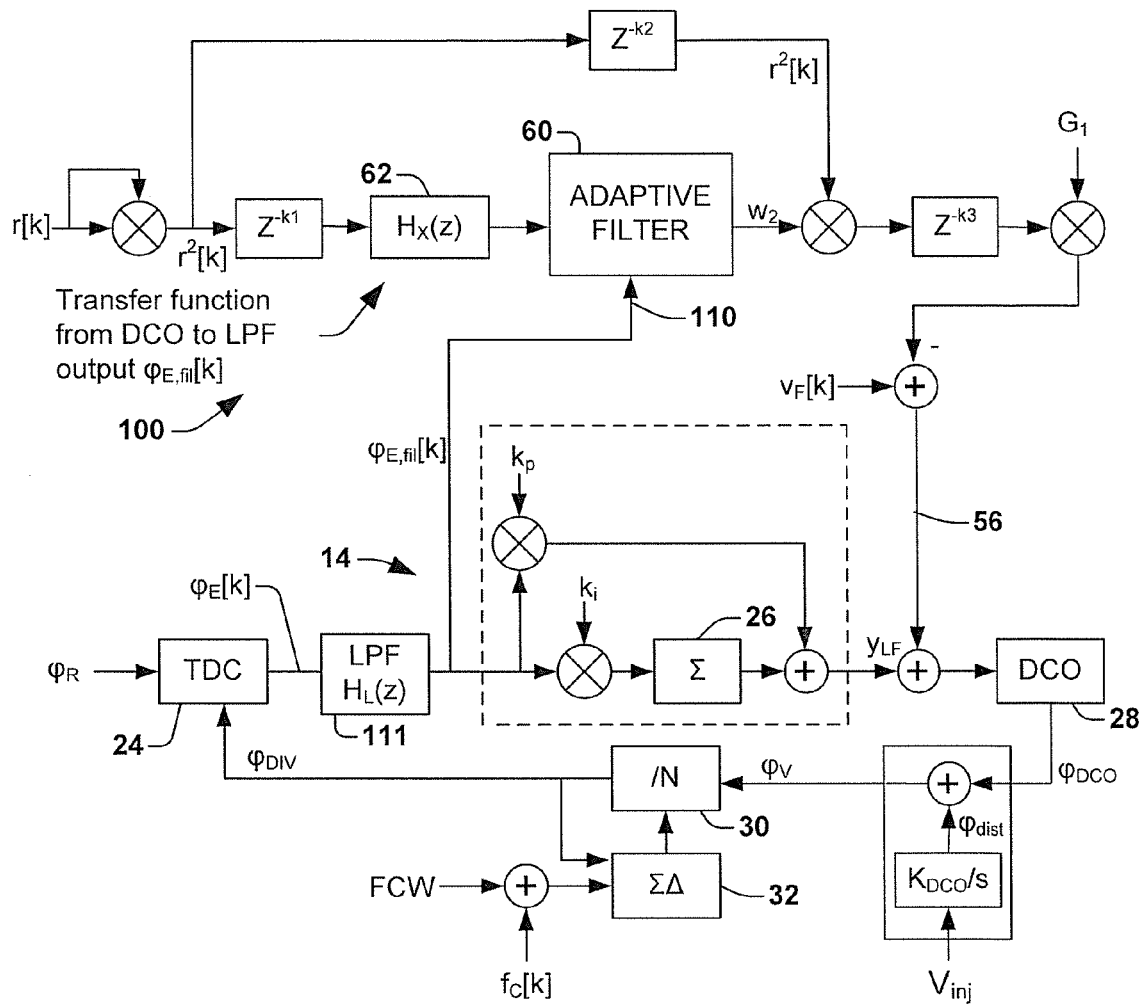
FIG. 12 is a block diagram illustrating a transmitter employing a polar modulator architecture having a distortion compensation unit according to another example.

FIG. 12 shows an example in which a lowpass filtered version of the TDC (i.e., $\phi_{E,fil}[k]$) is used as an input 110 to the adaptive filter 60. The filter $H_x(z)$ 62 resembles the transfer function from the DCO injection point to the output 110 of the lowpass filter 111 which is a filtered version of the phase error ($\phi_{E,fil}[k]$) at the TDC output or at least an approximation of the transfer function.

In one example the cancellation signal is fed only to the feedforward DCO modulation path, but not to the compensating lowpass path at the Multi-Modulus Divider 30. This is because the undesired frequency distortion signal which should be cancelled is injected at the DCO as a frequency disturbance. Therefore, in order to match of the loop transfer functions for both the disturbance and the cancellation to the PLL output, it is advantageous that the same input be used. This is ensured by adding the cancellation signal 56 to the input of the DCO 28. The primary error of the transfer function is a gain and a delay error which can be compensated.

To compensate the delay mismatch between the disturbance and the cancellation, in one example a programmable delay 112 is inserted in the cancellation path. This delay, in one example, aligns the skew of the two paths from the AM path where the cancellation signal is taken from over the RF path and the disturbance source (e.g., the power amplifier (PA)) to the coupling path into the DCO from the AM path where the cancellation signal is taken from over the cancellation block to the modulation input of the DCO.

In one example, the adaptive filter 60 may employ a Least Mean Squares (LMS) type algorithm to determine the compensation coefficient(s). In this case we minimize the cost function J $$\min_{w_2} J(w) = \min_{w_2} e^2[k] = (f_{dist}[k] * h_v[k] = w_2[k]r[k]^2 * h_x[k])^2 \quad \text{Eq. 12}$$

wherein $f_{dist}[k]$ reflects the frequency induced distortion experienced by the DCO.

For the second order correction, the recursive equation for the coefficient update is determined according to the formula $$w_2[k] = w_2[k-1] + \mu_{w2}(-de^2/dw_2). \quad \text{Eq. 13}$$

$$w_2[k] = w_2[k-1] + \mu_{w2}(-\nabla J_{w2}). \quad \text{Eq. 14}$$

Note that $J = e^2$ is the cost function highlighted above, and $\mu_{w2}$ is a variable stepsize. The term $(\nabla J_{w2} = de^2/dw_2)$ is the gradient of the cost function respect to the unknown parameter $w_2$. The minus sign of the coefficient update in Eq. 13 and Eq. 14 stems from the fact that the update is performed in direction to the negative gradient. The factor $\lambda_{w2}$ is the widely known stepsize. Ideally, in steady state the cofficient should converge to the optimal value $$w_2[k] \xrightarrow[k \to \infty]{} \hat{w}_2 = w_{2,opt}$$

such that the cost function approaches in the long-term the minimum, i.e $$J[k] \xrightarrow[k \to \infty]{} J_{min}$$

The expression for the gradient can be derived from the cost function given above $$\nabla J_{w2} = \frac{dJ}{dw_2} = \frac{de^2}{dw_2} = 2e[k] \cdot \underbrace{\underbrace{r^2[k] * h_x[k]}_{=g_{w2}}}_{=g_{w2,fil}[k]} \quad \text{Eq. 15}$$

In which e[k] is the error signal 68 measured at the TDC output. In general case the error signal could be provided by any kind of phase or phase/frequency detector. The term $g_{w2,fil}[k]$ represents the reference data which is obtained by filtering the envelope data $r[k]^2$ by the filter 62 with the impulse response $h_x$. Note that the filtered envelope data $r^2[k] * h_x[k]$ corresponds to the inner derivative of the cost function that is determined as $g_{w2,fil} = de/dw_2$. Hence, the signal $g_{w2,fil} = de/dw_2$ which is required for the adaptive filter 60 as an input is generated by filtering the envelope data squared with a filter $H_x(s)$. This filter could be viewed as a "conditioning" filter that conditions the required data to generate the so-called "reference data" for the adaptive algorithm.

The update of the coefficients is obtained from the recursive formula which describes the function inside the adaptive filter block 60

$$w_x[k] = w_2[k-1] - \mu_{w2} \cdot \nabla J_{w2} = w_2[k-1] - \mu_{w2} \cdot e[k]r^2[k] * h_x[k] \quad \text{Eq. 16}$$

which can be written as $$w_2[k] = w_2[k-1] - \mu_{w2} \cdot e[k]g_{w2}[k] * h_x[k] = w_2[k-1] - \mu_{w2} \cdot e[k]g_{w2,fil}[k] \quad \text{Eq. 16b}$$

The factor of two is without loss of generality absorbed into the stepsize factor $\lambda_{w2}$. According the Eq. 16b we can deduce that the coeffcients update requires the error data e[k] provided by the DPLL and the inner derivative of the cost function $g_{w2,fil} = de/dw_2$ which is given as the convolution $g_{w2}[k] * h_x[k]$ in which hx[k] is the impulse response from the correction input to the phase/frequency error at TDC output. Finally, the compensation signal is obtained by multiplying the coefficient $w_2$ which is the output of the adaptive filter 60 and the envelope squared signal $r^2[k]$, i.e.

$$f_{corr}[k] = w_2[k]r^2[k] \quad \text{Eq. 17}$$

In another example, the adaptive filter 60 may employ a Least Squares algorithm.

The cost function is then minimized as follows:

$$\min_{w_1, w_2} (e^2) = \sum_i |d(i) - (u_{i,1}w_1 + u_{i,2}w_2)|^2, \quad \text{Eq. 18}$$

wherein $\{d[i]\}$ are the observations, i.e. $\{d[i]\} = \{f_{dist}[i] * h_v[i]\}$ provided by the TDC output in the absence of the correction signal given to the adaptive filter as one input. The quantities $u_{i,1} = r_i * h_x[i]$, $u_{i,2} = r_i^2 * h_x[i]$ are provided as a second input to the adaptive filter 60 shown in FIG. 6. Likewise, the problem statement could be compactily rewritten in vector notation as $$\min_w e^2 = \min_w \|y - Hw\|^2,$$

where the N observations are collected in the vector $$y = \begin{bmatrix} d_1 \\ \vdots \\ d_N \end{bmatrix},$$

and the data matrix H is composed of $$H = \begin{bmatrix} u_{1,1} & u_{2,1} \\ \vdots & \vdots \\ u_{1,N} & u_{2,N} \end{bmatrix}$$

and the vector w collects the estimations parameters $w = [w_1 \ w_2]$.

Figure 6:
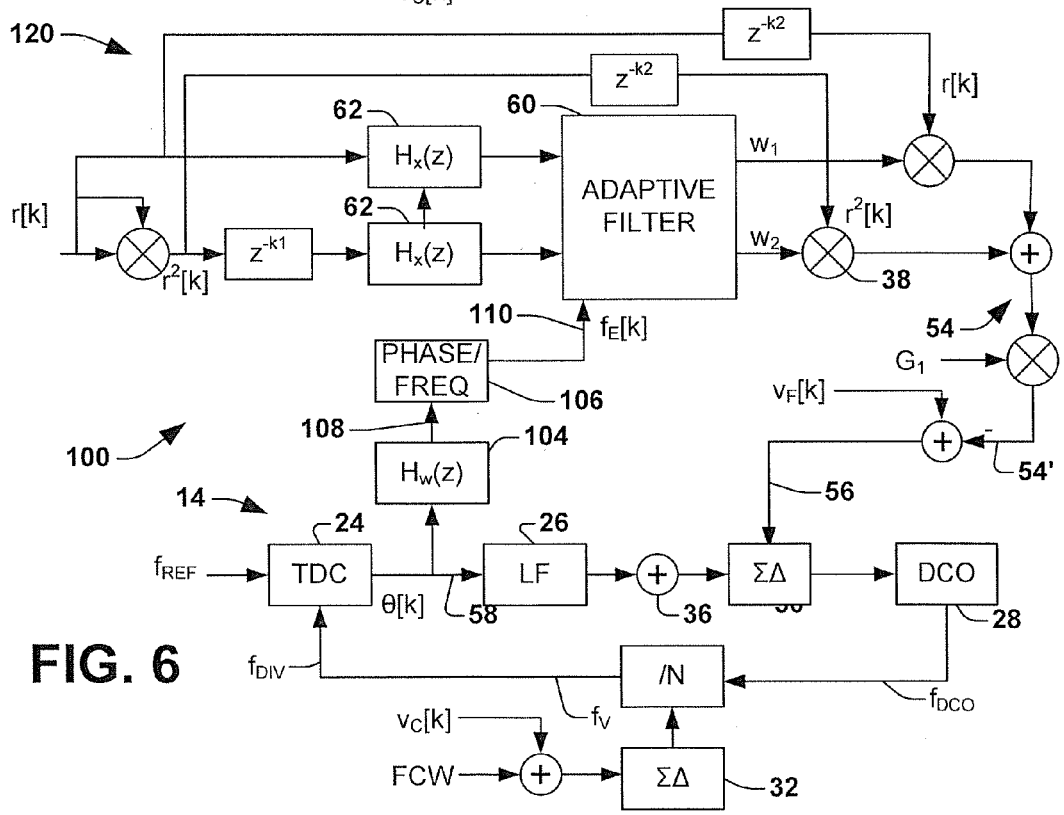
FIG. 6 is a block diagram illustrating a transmitter employing a polar modulator architecture having an adaptive filter as part of the compensation unit that operates to generate multiple compensation coefficients for first and second order polynomial.

On one embodiment, referring to FIG. 6 the observation y would be filtered frequency error signal 110, denoted as $f_E[k]$.

In accordance with the Least Squares problem, the optimal solution may be characterized as:

$$w_{opt} = \underbrace{(H^T \cdot H)^{-1} H^T}_{P_H} y = P_H y \qquad \text{Eq. 19}$$

In which $P_H$ is called the projection matrix and y are the observations 110.

Figure 4:
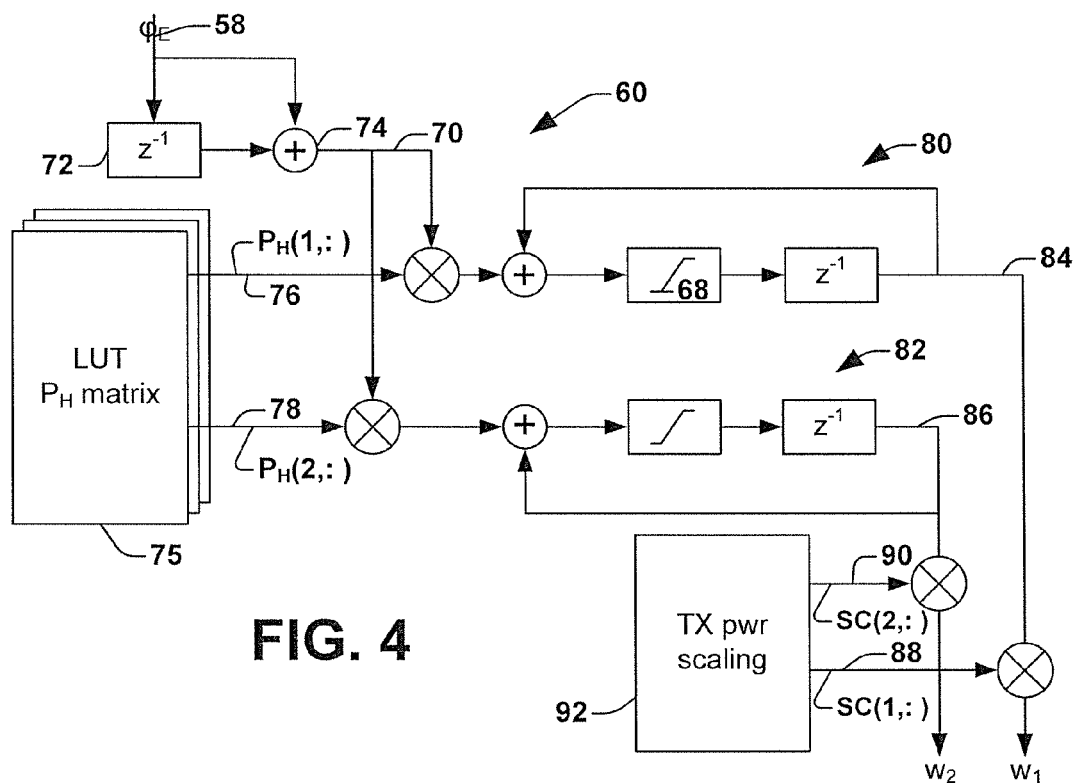
FIG. 4 is a block diagram illustrating further details of an adaptive filter for generating a compensation signal according to one aspect of the disclosure.

The projection matrix $P_H$ can be precomputed and stored in a loop up table (LUT), in one example as shown in FIG. 4. It should be noted, that in an alternative example, for different DPLL bandwidths, the projection matrix $P_H$ can be recalculated and stored in the LUT. The different bandwidths settings of the PLL are implicitly taken into account by the impulse response $h_x[k]$. This stems from the fact that the entries of the H-matrix given as $u_{i,1}=r_i*h_x[i]$, $u_{i,2}=r_i^2*h_x[i]$ depend on $h_x[k]$. In the frequency domain the transfer function $H_x(s)$ of the impulse response $h_x[k]$ is determined by $$H_X(s) = \frac{K_{DCO}/s}{\left(1 + \frac{K_{DCO}}{s} \cdot H_{LF}(s)\right)} \cdot H_2(s) \qquad \text{Eq. 20}$$

where $H_{LF}(s)$ is the loop filter transfer function and $H_2(s)$ is the cascaded filter consisting of an optional low-pass filter at the input of the adaptive filter to filter the quantization noise and the phase-to-frequency conversion which exhibits the transfer function $H_{\phi/f}(s)=s$. It is sufficient to use an approximation of the actual transfer $H_x(z)$ given by Eq. 20. The approximation should be accurate enough such that the distortion signal $f_{dist}[i]*h_v[i]$ is not affected. In other words, the bandwidth of the filter approximation should be large enough such that the bandwidth of $f_{dist}[i]*h_v[i]$ is not limited.

Those who are skilled in the art will immediately recognize that we could have also formulated the problem by means of other algorithms. In one example we could use a weighted least-squares approach. In this case the cost function could be compactly written $$\min_w e^2 = \min_w \|y - Hw\|_V^2 = \min_w (y - Hw)^T V (y - Hw)$$

and V is a Hermitian positive-definite matrix weighting matrix. In case V is a diagonal matrix, the elements assign different weights to the entries of the error vector (y−Hw).

As an example, for a type-I PLL configuration the transfer function of $H_x$ can be approximated by $$H_{X,approx}(z^{-1}) \approx \frac{1 - z^{-1}}{1 - (\bar{k}_p - 1)z^{-1}} \qquad \text{Eq. 21}$$

where $k_p$ is the loop filter gain. In this approximation the low-pass filter which attenuates the high frequency quantization noise included in $H_2(s)$ has been considered with a gain of "1" since its bandwidth is much higher than the bandwidth of the distortion signal $f_{dist}[i]*h_v[i]$.

In case of a type-I PLL, the loop filter transfer function is simply a gain factor, i.e. $H_{LF}(s)=k_p$. For different bandwidth the gain factor $k_p$ is adjusted which results in a change of the transfer function $H_x(s)$ accordingly. As consequence, we obtain different projection matrices $P_H$ (see FIG. 4 discussed infra) for the different PLL configurations which can be pre-stored in a ROM like fashion or computed by a processor during initialization or during run-time before east transmit burst.

One advantage of this method is that the coefficients can be directly estimated based on a training sequence (as will be discussed infra with respect to FIG. 8) as opposed to an iterative algorithm in which coefficients are slowly updated over time reaching the optimal coefficients in steady state. Hence, this direct approach does not suffer from a long convergence speed, but the coefficient can be computed directly at the end of the training sequence. On the other hand, the advantage of an iterative method (as will be discussed infra with respect to FIG. 9) is the ability to track variations during the actual payload transmission. In this way, it is ensured that the coefficients track small variations respect to time. Both of these methods, the direct and iterative approach, are supported by this underlying disclosure. (See FIGS. 8-9).

Finally, with the result of the estimation the correction signal can be determined according to $f_{corr}[k]=w_{1,opt}r[k]+w_{2,opt}r[k]^2+\ldots$. Further, in the present example of FIG. 3A a two-point modulation scheme is presented, wherein modulation occurs at one point within the feedback loop via components 30 and 32 along with input modulation data FCW and $f_c[k]$, and at a second point downstream of the loop filter 26 in the feedforward path at summation node 36. The compensation signal 56 is supplied in the feedforward path. It should be appreciated that the various aspects of the present disclosure are also applicable in a one-point modulation scheme in the feedback path, and all such variations are contemplated as falling within the scope of the present disclosure.

In another example, the adaptive filter 60 generates a plurality of compensation coefficients (e.g., $w_1$, $w_2$). In this example, as illustrated in FIG. 4, a phase error 58 (e.g., a low pass filtered phase version of the phase error) output from the TDC 24 is converted into a frequency error 70 via a differentiation operation using components 72 and 74, for example. A look-up table (LUT) 75, in one example, contains the calculated projection matrix values $P_H$, which in one example comprises a 2×N matrix, each matrix having N columns. In this example, three projection matrices are stored in the LUT to support three different DPLL bandwidths, however, this number may vary and such variations are contemplated by the present disclosure. The projection matrix data 76, 78 is multiplied with the frequency error data 70 and processed in paths 80, 82 that include saturation handlers, which are sometimes referred to as limiters or clipping components, to form processed data 84, 86. The processed data 84, 86, in one example, may be multiplied with scaling data 88, 90 from registers 92 or any form of storage that contain scaling factors based on transmit power, for example. The resultant scaled processed data 94, 96 comprises the two predistortion coefficients $w_1$ and $w_2$.

Figure 5:
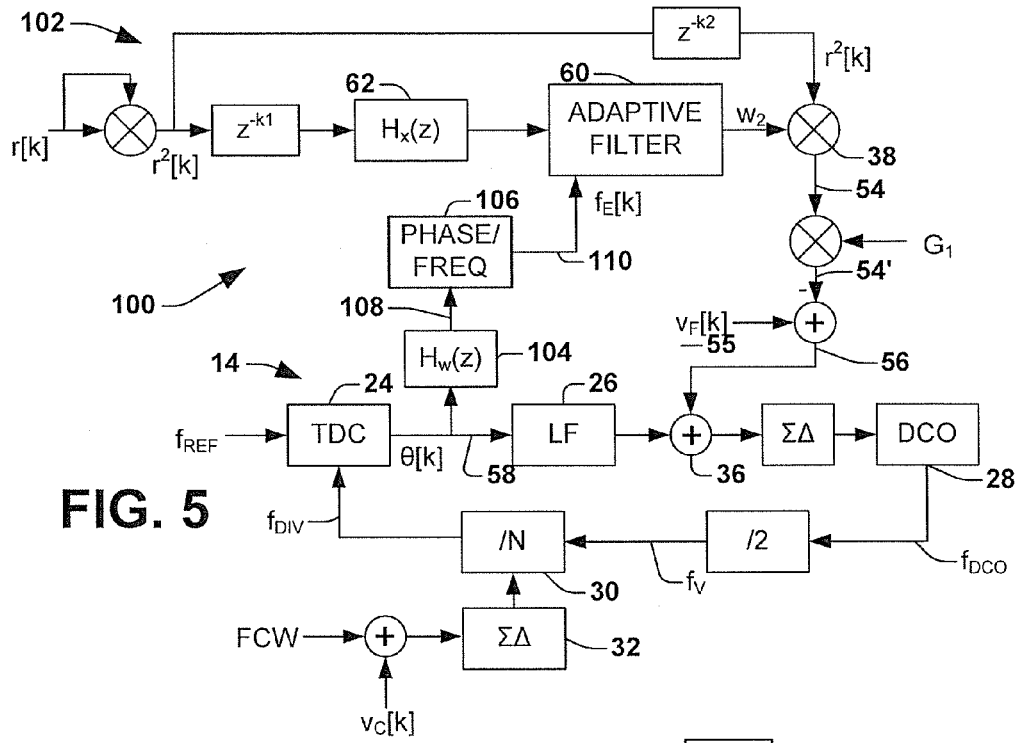
FIG. 5 is a block diagram illustrating a transmitter employing a polar modulator architecture having an adaptive filter as part of the compensation unit that utilizes a smoothing filter to reduce high frequency noise from phase or frequency data prior to generating the compensation signal.

In accordance with another example of the present disclosure, referring to FIG. 5, a portion 100 of a transmitter is provided. The transmitter portion 100 shows the DPLL 22 and the distortion compensation circuit 102. In this example, the distortion compensation circuit 102 includes a whitening or smoothing filter 104 and an optional differentiator component 106. In one example, the smoothing filter 104 comprises a low pass filter that operates to decorrelate quantization noise associated with the TDC 24 so that the frequency resolution of the error data 58 is sufficiently precise to perform the estimation to generate the predistortion coefficient(s). It has been appreciated by the inventor of the present disclosure that at least in some instances the quantization noise may contain high frequency spectral components and such components can result in an averaging operation in the LMS estimation to be insufficient to obtain an estimate with a sufficiently low variance. The smoothing filter 104 operates to remove the high frequency noise to generate a substantially smooth filtered error signal 108 that may be used in the adaptive filter 60 to generate the one or more predistortion coefficients. In one example, $G_1$ is the DCO normalization factor provided by the DPLL. In general $G_1$=fref/Kdco where the constant fref is the reference frequency and Kdco is the actual DCO gain. This factor is employed to scale the compensation signal adequately since the DCO gain is subject to process, voltage and temperature. Therefore the applied correction signal may be written as $f_{corr,scaled}[k]=f_{corr}[k] \times G_1$.

In one example of the present disclosure, the smoothing filter 104 comprises a finite impulse response (FIR) filter with a length of $N=2^w$. In one example, such a filter may be implemented using a random access memory (RAM) with a subsequent shift operation of W-bits to account for a normalization factor. In one example, the smoothing filter 104 provides a running average of the phase error 58. In one example, the filtered, averaged phase error 108 is subsequently differentiated using the differentiator component 106 to form filtered frequency deviation or error data 110 as illustrated in FIG. 5. The adaptive filter 60 employs the filtered frequency deviation data 110 in a manner similar to that described supra to generate the predistortion coefficients that form the compensation signal 54 that is added to the frequency modulation data f[k] to generate the predistorted frequency modulation data 56 that is injected into the feedforward path of the DPLL 22. In another example the smoothing of filter 104 could be realized as a cascaded 1$^{st}$ order low-pass IIR filter section in which the transfer function of a single stage is given as:

$$H_{IIR1}(z) = \frac{\lambda z}{z-(1-\lambda)}.$$

In FIG. 5, the distortion compensation circuit 102 provides a single, second order predistortion coefficient $w_2$. In accordance with another example, as provided in FIG. 6, a distortion compensation circuit 120 is disclosed that provides first and second order compensation. In the disclosed example, the adaptive filter 60 generates two predistortion or compensation coefficients $w_1$ and $w_2$ to form a polynomial compensation signal 54 having a linear and quadratic term. That is added to the frequency data f[k] as fcomp[k]=$w_1$r[k]+$w_2$r[k]$^2$. As shown in FIG. 6, r[k] and r$^2$[k] are filtered in compensation filters 62 that account for the transfer function (TF) 64 between the DCO 28 and the TDC, and then to the output of the filter 60. In other words it is the transfer function Hx from the injection point of the compensation to the input of the adaptive filter. The reference data which are required r[k] and r$^2$[k] are subject to the same filter transfer function $H_x$(s) before being applied to the input of the adaptive filter 60 that may operate similar to the example illustrated in FIG. 4.

In one example, a cost function is minimized in a fashion similar to that highlighted previously.
The frequency distortion experienced at the DCO can be written as $$f_{dist}[k]=h_1\alpha_1 K_{DCO,1}r[k]\cos(\phi_1)+h_2\alpha_2 K_{DCO,2}r^2[k]\cos(\phi_2) \quad \text{Eq. 22}$$

where $h_1$, $h_2$ are unknown gain factors of the coupling path, $\alpha_1$ $\alpha_2$ and first and second order coefficient which is also unknown. $\phi_1$ and $\phi_2$ are arbitrary phase offsets and $K_{dco,1}$, $K_{dco,2}$ are unknown DCO sensitivity factors.

In this case the compensation signal shall be function of two coefficients according to the polynomial $$f_{comp}[k]=w_1[k]r[k]+w_2[k]r[k]^2 \quad \text{Eq. 23}$$

Accordingly, we can write the cost function, which is the basis to develop the hardware architecture as $$\min_{w_1,w_2} J(w) = \quad \text{Eq. 12}$$
$$\min_{w_1,w_2} e^2[k] = [f_{dist}[k]*h_v[k]-(w_1[k]r[k]+w_2[k]r[k]^2)*h_x[k]]^2$$

in which the coefficients are collected by w={w1,w2}. For the case of LMS, the parameters $w_2$, $w_1$ are updated according to the widely known recursive equations which is effectively, accomplished inside the adaptive filter block 60:

$$w_1[k]=w_1[k-1]+\mu_{w1}(-de^2/dw_1), \quad \text{Eq. 25}$$

$w_1[k]=w_1[k-1]+\mu_{w1}(-\nabla J_{w1})$ in which $\lambda_{w1}$ is stepsize and $$w_2[k]=w_2[k-1]+\mu_{w2}(-de^2/dw_2), \quad \text{Eq. 26}$$

$w_2[k]=w_2[k-1]+\mu_{w2}(-\nabla J_{w2})$ in which $\lambda_{w2}$ is another stepsize.

With the error signal e[k] 110 measured as the difference of the filtered phase error 108 provided by the TDC output 58, the frequency error can be characterized by:

$$e^2[k]=(f_{dist}[k]*h_v[k]-(u_1[k]w_1[k-1]+u_2[k]w_2[k-1]))^2, \quad \text{Eq. 27}$$

$$u_1[k]=r[k]*h_x[k], \text{ and } u_2[k]=r^2[k]*h_x[k]. \quad \text{Eq. 28}$$

$h_x$ is the impulse response of $H_x$(z) from the DCO injection point to the TDC output, and then to the input of the filter 60. Finally, $f_{dist}$[k] represents the induced distortion experienced at the DCO.

The gradients respect to the parameters $w_1$, $w_2$ which are going to be estimated are given as $\nabla J_{w1}$=(de$^2$/dw$_1$) and $\nabla J_{w2}$=(de$^2$/dw$_2$) which yields the gradient respect $w_1$ as $\nabla J_{w1}$=2e[k]·r[k]*h$_x$[k] where "*" denotes the convolution operator and in a similar way, the gradient respect to $w_2$ is given as $$\nabla J_{w2}=-2e[k]\cdot r^2[k]*h_x[k]. \quad \text{Eq. 29}$$

The expression for the gradients can be easily derived from the cost function given above $$\nabla J_{w_1} = \frac{dJ(w)}{dw_1} = \frac{de^2}{dw_1} = 2e[k]\cdot \underbrace{\underbrace{r[k]}_{=g_{w1}}*h_x[k]}_{=g_{w1,fil}[k]} \quad \text{Eq. 30}$$

and $$\nabla J_{w_2} = \frac{dJ(w)}{dw_2} = \frac{de^2}{dw_2} = 2e[k]\cdot \underbrace{\underbrace{r^2[k]}_{=g_{w2}}*h_x[k]}_{=g_{w2,fil}[k]} \quad \text{Eq. 31}$$

in which e[k] is the error signal 68 measured at the TDC output. The term, $g_{w1,fil}$[k] $g_{w2,fil}$[k] represent the reference data which are obtained by filtering the envelope data r[k] and the envelope squared r[k]$^2$ by the filter 62 with the impulse response $h_x$.

The error signal e[k] corresponds to the signal 110 in FIG. 6 which is obtained from the phase-detector or TDC output of the PLL. The envelope r[k] and envelope squared $r^2$[k] represent the two inputs signals applied to the filter $H_x$ 62. Consequently, $r^2$[k]*$h_x$[k] and r[k]*$h_x$[k] denote the output of the filter 62 which is subsequently applied to the adaptive filter 60 in FIG. 6. The input data 60, obtained from 62, of the adaptive filter is in general called the reference data. The factor of two in $\nabla J_{w_1 1}$ and $\nabla J_{w_1 2}$ (cf. Eq. 30 and 31) can be easily absorbed in the stepsize.

The update equations for the coefficients $w_1$ and $w_2$ can be written as $$w_1[k]=w_1[k-1]-\mu_{w1}\cdot \nabla J_{W1}=w_1[k-1]-\mu_{w1}\cdot e[k]r[k]*h_x[k] \quad \text{Eq. 32}$$

$$w_2[k]=w_2[k-1]-\mu_{w2}\cdot \nabla J_{W2}=w_2[k-1]-\mu_{w2}\cdot e[k]r^2[k]*h_x[k]. \quad \text{Eq. 33}$$

In the above example e[k] and $r^2$[k]*$h_x$[k], r[k]*$h_x$[k] represent the input data provided to the adaptive filter 60 in FIG. 6. Finally, the compensation signal is obtained by multiplying the coefficients $w_1, w_2$ provided by the LMS 60 with the envelope data and the envelope squared data, i.e. $f_{comp}$[k]=$w_1$[k]r[k]+$w_2$[k]r[k]$^2$. Ideally, in steady-state the coefficients converge to the optimal value such that the cost function $e^2$[k] is minimized. The compensation signal is then normalized by the DCO-Gain normalization factor G1=1/Kdco and applied to the direct input of the DCO. Since the DCO is modeled as linear system which is a reasonably practical assumption we can apply superposition. In this case a perfect cancellation of the induced distortion may be obtained.

Based on this example which represents a compensation of $1^{st}$ and $2^{nd}$ order degree, i.e. $f_{comp}=w_1\cdot r+w_2\cdot r^2$, we can easily derive the hardware for an arbitrary order N. The compensation signal for the general case is given as $f_{comp}=w_1\cdot r+w_2\cdot r^2+\ldots w_N\cdot r^N$. This problem corresponds to an N-dimensional optimization problem which is expressed by the cost function $$\min_{w_i, i=1,\ldots,N} J(\underline{w}) = \min_{w_i, i=1,\ldots,N} e^2[k] = [f_{dist}[k]*h_v[k] - (w_1[k]r[k] + w_2[k]r[k]^2 + \ldots ++w_N[k]r[k]^N)*h_x[k])]^2$$

It requires N reference data input signals applied to the input of the adaptive filter 60 as visualized in FIG. 3B and 3C, which are $r^n$[k]*$h_x$[k] with n=1,...,N and in addition the error signal e[k] 110 similar to FIG. 6. The signals are generated by the computation unit in FIG. 3B are obtained by deriving the cost function respect to the parameters $w_n$ with n=1,..., N, which can be expressed as $$\nabla J_{wn} = \frac{dJ(w)}{dw_n} = 2\underbrace{er[k]^n*h_x[k]}_{=g_{wn,fil}} \text{ and } n=1,\ldots,N$$

In other words $g_{wn,fil}$ is the inner derivate of the cost function $\nabla J_{wn}$ which could be written as $$g_{wn,fil} = \frac{de(w)}{dw_n} = \underbrace{r[k]^n*h_x[k]}_{=g_{wn,fil}} \text{ and } n=1,\ldots,N$$

Obviously, the computation unit in FIG. 3B generates the data $g_{wn}$, which is $r^1$[k], $r^2$[k], ... $r^N$[k] for n=1, ... N. It requires (N-1) multipliers and likewise N filters $h_x$[k] to generate the reference data $g_{wn,fil}=r^n$[k]*$h_x$[k] with n=1, ... ,N. These filtered envelope signals are applied as an input to the adaptive filter 60. The coefficients $w_n$ with n=1,..., N are updated according to equation $$w_n[k] = w_n[k-1] - \mu_{wn} \cdot \frac{dJ}{dw_n} = \quad \text{Eq. 34}$$
$$w_n[k-1] - \mu_{wn} e[k] \underbrace{\underbrace{r^n[k]}_{g_{wn}} * h_x[k]}_{g_{wn,fil}} \text{ with } n=1,\ldots,N.$$

In which the factors $\mu_{wn}$ are the N stepsize factors.

In another example, a cost function is minimized in a fashion similar to that highlighted previously. In this case the oscillator is subject to N-path coupling. Effectively the $2^{nd}$ order distortion is injected to the oscillator over N different paths in which the path are subject to different gains and phases. Hence, the distortion could be written as $$f_{dist}[k]=h_{21}\alpha_{21}K_{DCO,21}r^2[k]\cos(\phi_1)+ \quad \ldots \quad + h_{2N}\alpha_{2N}K_{DCO,2N}r^2[k]\cos(\phi_N) \quad \text{Eq. 35}$$

Where $h_{2n}$ are the gain factors, $\alpha_{2n}$ the second order coefficient and $\phi_n$ are the phases of the different paths, $K_{dco,2n}$ are different DCO sensitivity factors.

$$f_{dist}[k]=(h_{21}\alpha_{21}K_{DCO,21}\cos(\phi_1)+ \ldots +h_{2N}\alpha_{2N}K_{DCO,2N}\cos(\phi_N))\cdot r^2[k]. \quad \text{Eq. 36}$$

Assuming that the parameters $h_{2n}$, $\alpha_{2n}$, $\phi_n$, $K_{dco,2n}$ are constant, we can add these parameters to a single unknown parameter. Hence, even in the presence of N-path coupling it is sufficient to compensate the distortion with the signal given as $$f_{comp}[k]=w_2[k]r^2[k] \quad \text{Eq. 37}$$

Accordingly, we can write the cost function, which is the basis to develop the hardware architecture as $$\min_{w_2} e^2[k] = [f_{dist}[k]*h_v[k] - f_{comp}[k]*h_x[k])]^2 \quad \text{Eq. 38}$$

As illustrated in the previous example, we easily estimate $w_2$ and apply the frequency correction to the DCO direct feed.

In another example, a cost function is minimized in a fashion similar to that highlighted previously. In this case the oscillator is subject to N-path coupling. Hence compensation signal shall be function of N coefficients $w_{2n}$ with n=1,... N and N unknown phase offsets $\theta_n$. The desired compensation function can be written as $$f_{comp}[k]=+\sigma(r-r_1)w_{21}[k](r[k]-r_1)^2+\ldots +\sigma(r-r_N) w_{2N}[k](r[k]-r_N)^2 \quad \text{Eq. 39}$$

In which $\sigma(r-r_n)$ is the step-function which is 1 for $r>r_n$ otherwise 0. This accounts the fact that the distortion may be induced if a certain threshold value $r_n$ is exceeded.

Accordingly, we can write the cost function, which is the basis to develop the hardware architecture as $$\min_{w_{21},\ldots w_{2N},\theta_1\ldots\theta_N} e^2[k] = [f_{dist}[k]*h_v[k] - f_{comp}[k]*h_x[k]]^2 \quad \text{Eq. 40}$$

The gradients can be computed $$\nabla J_{wn} = \frac{de^2}{dw_{2n}} = 2e[k]\cdot\underbrace{(r[k]-r_n[k-1])^2 * h_x[k]}_{=g_{wn,fil}[k]} \quad \text{Eq. 41}$$

Which is updated for $r > r_n$ $$\nabla J_{rn} = \frac{de^2}{dr_n} = 2e[k]\cdot\underbrace{2w_{2n}[k-1](r[k]-r_n[k-1])*h_x[k]}_{=g_{rn,fil}[k]} \quad \text{Eq. 42}$$

Figure 13A:
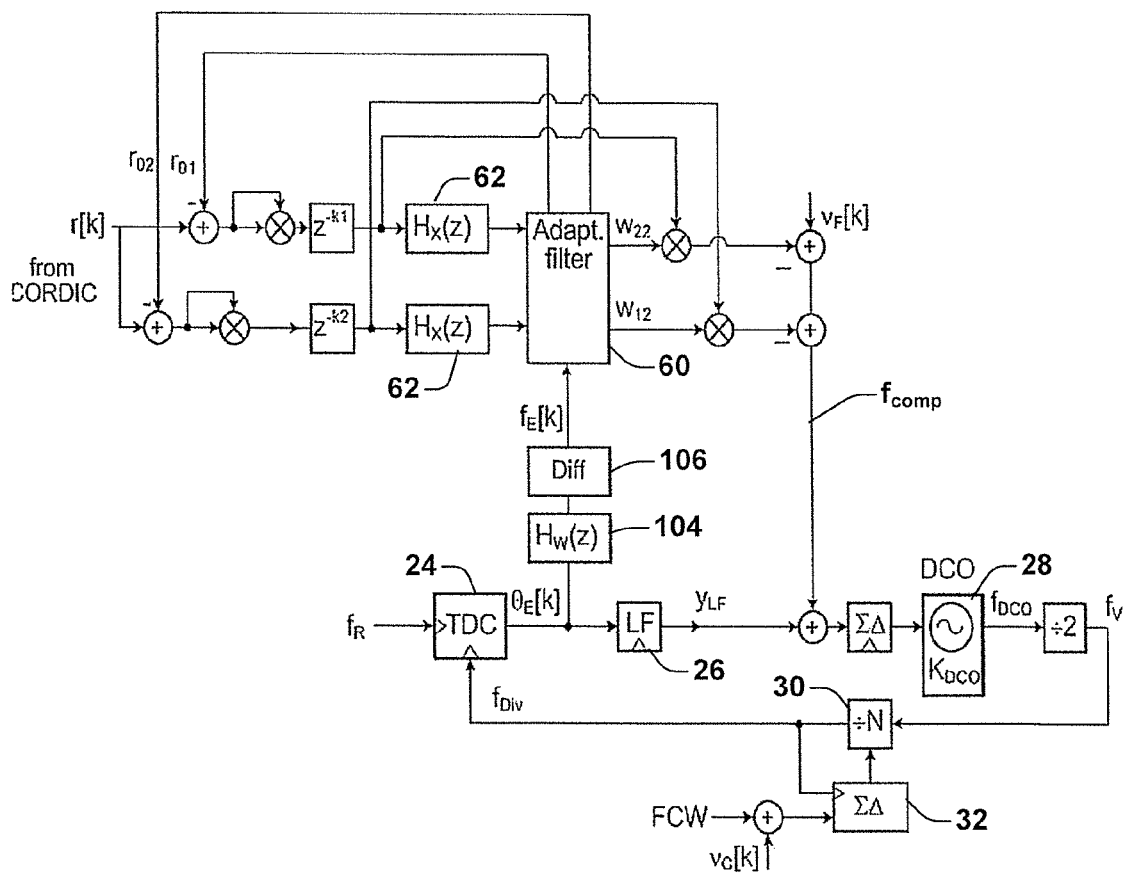
FIGS. 13A-13B are block diagrams illustrating a transmitter employing a polar modulator architecture having a distortion compensation unit according to another example

The update equations are determined according to $$r_n[k]=r_n[k-1]-\mu_{rn}\cdot\nabla J_{rn} \quad \text{Eq. 43 and}$$

$$w_{2n}[k]=w_{2n}[k-1]-\mu_{w2n}\cdot\nabla J_{wn} \quad \text{Eq. 44}$$

which describe the hardware implementation which is shown in FIG. 13A.

Figure 7A:
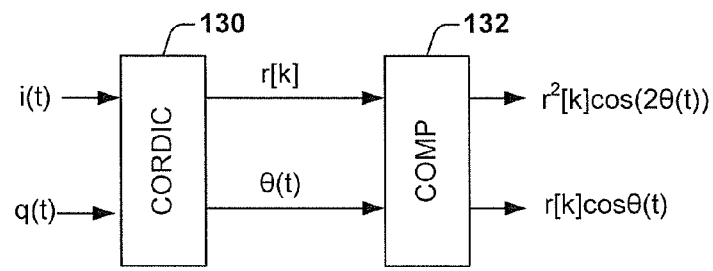
FIGS. 7A-7C are block diagrams of a transmitter that employs a vector modulator architecture that converts the Cartesian data inputs into polar format for generation of a compensation signal according to alternative examples.
Figure 7A:
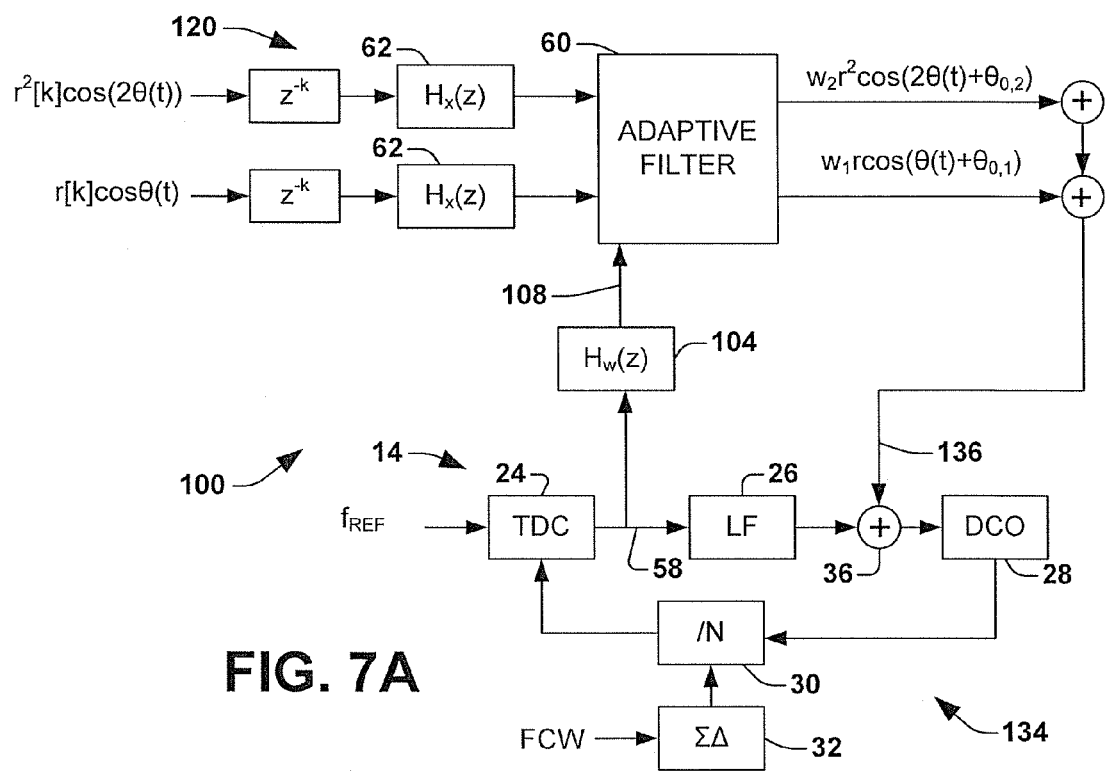

In accordance with another example of the present disclosure, a Cartesian modulator may operate in a similar principle as the polar architecture highlighted supra. In such a case the time varying in-phase and quadrature signals i(t) and q(t) are converted into polar form via a converter as illustrated in FIG. 7A such as a CORDIC 130 to generate the envelope signal r[k] and the modulating phase θ(t), which are then converted again via a conversion component 132 into first and second order amplitude inputs $r^2[k]\cos(2\theta(t))$ and $r[k]\cos(\theta(t))$. As shown in FIG. 7A, the amplitude inputs are adjusted via the compensation filters 62 using the transfer function information of the DPLL 134. The DPLL 134 differs from pervious modulator circuits described above in that the DCO 28 is not modulated with frequency data f[k], but instead is modulated via the amplitude inputs generated at compensated inputs $$f_{comp}=w_1\cdot r(t)^1\cdot\cos(\theta(t)+\theta_{01})+w_2\cdot r(t)^2\cdot\cos(2\theta(t)+\theta_{02}) \quad \text{Eq. 45}$$

that together form a compensation signal 136, in which $w_1, w_2$ are estimated gain coefficients and $\theta_{01}, \theta_{02}$ are the estimated phase shifts. The adaptive filter 60 receives filtered phase data 108 which is not further differentiated as in some previous examples. The adaptive filter 60 generates filter coefficients or estimates $w_1, w_2, \theta^{0,1}$ and $\theta_{0,2}$ using LMS or other estimations algorithms, and filtered phase/frequency error $\theta_E[k]$ 108 is the error signal, denoted as e[k], to be minimized.

$$\min_{w_1,w_2,\theta_{01},\theta_{02}} e^2 = \quad \text{Eq. 46}$$
$$[f_{dist}*h_v - (w_1 r^1 \cos(\theta(t)+\theta_{01}) + w_2 r^2 \cos(2\cdot\theta(t)+\theta_{02}))*h_x]^2$$

where for ease of notation we have omitted the timestamp k.

Figure 7B:
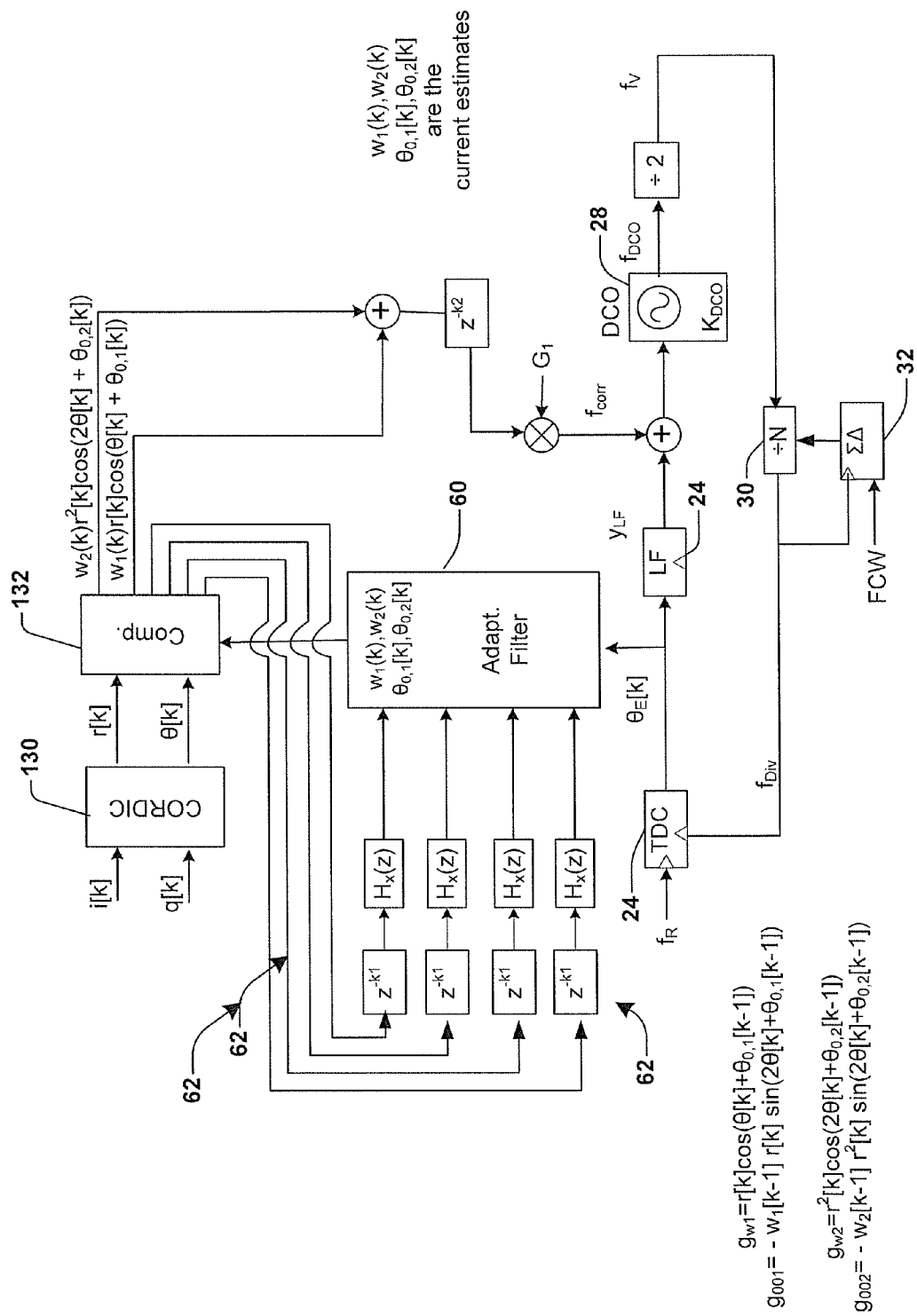

As illustrated here in FIG. 7B, the LMS algorithm requires four input signals as reference data. These are obtained by calculating the gradients respect to the unknown parameters $w_1, w_2, \theta_{0,1}, \theta_{0,1}$. The gradients respect to $w_1$ and $w_2$ are given by $\nabla J_{w1} = de^2/dw_1$, $\nabla J_{w2} = de^2/dw_2$ and the gradient respect to $\theta_{0,1}$ denoted as $\nabla J_{\theta_{0,1}} = de^2/d\theta_{0,1}$ and similarly, the gradient respect to $\theta_{0,2}$ is $\nabla J_{\theta_{0,2}} = de^2/d\theta_{0,2}$. The equations can be written as:

$$\nabla J_{w1} = \frac{dJ}{dw_1} = \frac{de^2}{dw_1} = -2e[k]\underbrace{\underbrace{r[k]\cos(\theta(t)+\theta_{0,1}[k-1])}_{=g_{w1}[k]}*h_x[k]}_{=g_{w1,fil}[k]} \quad \text{Eq. 47}$$

where instead of $\theta_{0,1}$ we take the previous estimate $\theta_{0,1}[k-1]$.

$$\nabla J_{w2} = \frac{dJ}{dw_2} = \frac{de^2}{dw_2} = -2e[k]\underbrace{\underbrace{r^2[k]\cos(2\theta(t)+\theta_{0,2}[k-1])}_{=g_{w2}[k]}*h_x[k]}_{=g_{w2,fil}[k]} \quad \text{Eq. 48}$$

where instead of $\theta_{0,2}$ we take the previous estimate $\theta_{0,2}[k-1]$.

$$\nabla J_{\theta_{0,1}} = \quad \text{Eq. 49}$$
$$\frac{dJ}{d\theta_{0,1}} = \frac{de^2}{d\theta_{0,1}} = 2e[k]\underbrace{\underbrace{w_1[k-1]r[k]\sin(\theta(t)+\theta_{0,1}[k-1])}_{=g_{\theta 1}[k]}*h_x[k]}_{=g_{\theta 1,fil}[k]}$$

where instead of $\theta_{0,1}$ we take the previous estimate $\theta_{0,1}[k-1]$ and for $w_1$ we take also the previous estimate $w_1[k-1]$.

$$\nabla J_{\theta_{0,2}} = \frac{dJ}{d\theta_{0,2}} = \quad \text{Eq. 50}$$
$$\frac{de^2}{d\theta_{0,2}} = 2e[k]\underbrace{\underbrace{w_2[k-1]r^2[k]\sin(2\theta(t)+\theta_{0,2}[k-1])}_{g_{\theta 2}[k]}*h_x[k]}_{=g_{\theta 2,fil}[k]}$$

where instead of $\theta_{0,2}$ we take the previous estimate $\theta_{0,2}[k-1]$ and for $w_2$ we take also the previous estimate $w_2[k-1]$.

Note that instead of choosing the previous estimate, we could also have chosen the $k_0$-previous estimate, i.e. $w_i[k-k_0]$, $\theta_{0,i}[k-k_0]$ or the any function of the previous estimates such as the mean or a moving average of the estimate.

In reference to FIG. 7B the signals $g_{w1}[k]$, $g_{w2}[k]$, $g_{\theta 1}[k]$, $g_{\theta 2}[k]$ are obtained by the computation unit 132. These are subsequently filtered by the transfer function $H_x(s)$ to generate finally the reference data signals $g_{w1,fil}[k]$, $g_{w2,fil}[k]$, $g_{\theta 1,fil}[k]$, $g_{\theta 2,fil}[k]$ which are fed to the adaptive filter 60 input. The error signal e[k] corresponds to the phase or the frequency error provided by the TDC 24.

The four parameters are updated according the LMS algorithm by $$w_1[k]=w_1[k-1]-\mu_{w1}\cdot\nabla J_{w1} \quad \text{Eq. 51}$$

$$w_2[k]=w_2[k-1]-\mu_{w2}\cdot\nabla J_{w2} \quad \text{Eq. 52}$$

$$\theta_{01}[k]=\theta_{01}[k-1]-\mu_{\theta 01}\cdot\nabla J_{\theta 1} \quad \text{Eq. 53}$$

$$\theta_{02}[k]=\theta_{02}[k-1]-\mu_{\theta 02}\cdot\nabla J_{\theta 2} \quad \text{Eq. 54}$$

where the factor of two has been absorbed into the stepsize factors.

Note, that we could also have solved this 4-dimensional optimization problem by utilizing least-squares methods, similar to the LS-estimation problem shown previously where the optimal solution is obtained by solving the linear equation system given in Eq. 19.

Like in the example of the polar modulator, we can also extend the compensation for the Cartesian modulator to an arbitrary order N. However, in the Cartesian case we have 2N parameters to estimate, namely N gain estimates $w_n$ and N phase estimates $\theta_{0,n}$ where $n=1,\ldots,N$.

In this case the compensation function can be written as $$f_{comp} = w_1 r \cos(\theta(t)+\theta_{01}) + \ldots + w_N r^N \cos(N \cdot \theta(t)+\theta_{0N}) \quad \text{Eq. 55}$$

Accordingly the cost function to be minimized yields $$\min_{\substack{w_1,\ldots,w_N \\ \theta_{01},\ldots,\theta_{0,N}}} e^2 = (f_{dist} * h_v - f_{comp} * h_x)^2 \quad \text{Eq. 56}$$

which resembles a 2N dimensional optimization problem.

Same as above, we compute the gradients for the coefficients $w_n$, i.e $\nabla J_{wn} = de^2(w_n,\theta_{0n})/dw_n$ and for the phase offsets $\theta_{0n}$ which is $\nabla J_{\theta n} = de^2(w_n,\theta_{0n})/d\theta_{0n}$ where $n=1,\ldots,N$. As a result; we obtain the signals $g_{w1}[k],\ldots,g_{wN}[k], g_{\theta 1}[k],\ldots, g_{\theta N}[k]$ generated by 132. Each of these signals is passed through a filter with the transfer function $H_x(s)$ generating the reference signals of the adaptive filter $g_{w1,fil}[k],\ldots,g_{wN,fil}[k], g_{\theta 1,fil}[k],\ldots,g_{\theta N,fil}[k]$. In other words, the derivative of the inner product of the cost function $g_{wn,fil}[k]$ defined as $g_{wn,fil} = de(w_n,\theta_{0n})/dw_n$ and $g_{\theta n,fil}[k]$ defined as $g_{\theta n,fil} = de(w_n, \theta_{0n})/d\theta_{0n}$ where $n=1,\ldots,N$ is provided out the output of the conditioning filters $H_x(s)$. As can be easily seen, with the given error signal $e[k]$ and the reference data $g_{\theta n,fil} = de(w_n, \theta_{0n})/d\theta_{0n}$ and $g_{wn,fil} = de(w_n,\theta_{0n})/dw_n$ we can compute the 2N parameters according to the LMS update equations $$w_n[k] = w_n[k-1] - \mu_{wn} \cdot \nabla J_{wn} \text{ with } n=1,\ldots,N, \quad \text{Eq. 57}$$

$$\theta_{0n}[k] = \theta_{0n}[k-1] - \mu_{\theta 0n} \cdot \nabla J_{\theta n} \text{ with } n=1,\ldots,N. \quad \text{Eq. 58}$$

where $$\cdot \nabla J_{\theta n} = 2 \cdot e \cdot g_{\theta n,fil} = 2 \cdot e \cdot \frac{de(w_n,\theta_{0n})}{d\theta_{0n}} = 2 \cdot e \cdot g_{\theta n} * h_x$$

with $$n = 1,\ldots,N$$

and $$\cdot \nabla J_{wn} = 2 \cdot e \cdot g_{wn,fil} = 2 \cdot e \cdot \frac{de(w_n,\theta_{0n})}{dw_n} = 2 \cdot e \cdot g_{\theta n} * h_x$$

with $$n = 1,\ldots,N.$$

Note that a generic block diagram of this kind embodiment is visualized in FIG. 3B and FIG. 3C. To reduce the computational effort those skilled in the art we immediately recognize that we can simplify the updated equations Eq. 57 and Eq. 58 by using approximations. In one example a signed-LMS could be used or in another example a signed-signed LMS could be engaged or other flavors such as RLS, NLMS.

In the Cartesian Case, the computation unit provides a signal that is filtered by compensation filter $H_x(s)$ generating an output signal that is the inner derivate of the cost function $J(w_i, \theta_{0i})$ respect to the estimation parameters $w_i$ and $\theta_{0i}$ is a with i being a scalar from the set of positive integer numbers, i.e $i \in N_{>0}$. The derivative of the cost function is defined as $g_{wi,fil} = de(w_i,\theta_{0i})/dw_i$ and $g_{\theta i,fil} = de(w_i,\theta_{0i})/d\theta_{0i}$. In case there exists N estimation parameters $w_i$ with $i=1,\ldots,N$ there are N compensation filters. Likewise, to generate N phase signal $g_{\theta n,fil} = de(w_n,\theta_{0n})/d\theta_{0n}$ N compensation filters $H_x(s)$ are required. The output signals of the compensation filters are in general called reference data which are fed into the adaptive filter 60 which performs the calculation of the coefficients based on LMS according to Eq. 57 and Eq. 58 or any other algorithm such LS.

In the Polar case, the cost function is only a function of $w_i$, with $i=1,\ldots,N$, hence the computation unit provides a signal that is filtered by compensation filter $H_x(s)$ generating an output signal that is the inner derivate of the cost function $J(w_i)$ respect to the estimation parameters $w_i$, which is given as $g_{wi,fil} = de(w_i)/dw_i$ where i is a scalar from the set of positive integer numbers, i.e $i \in N_{>0}$.

Figure 7C:
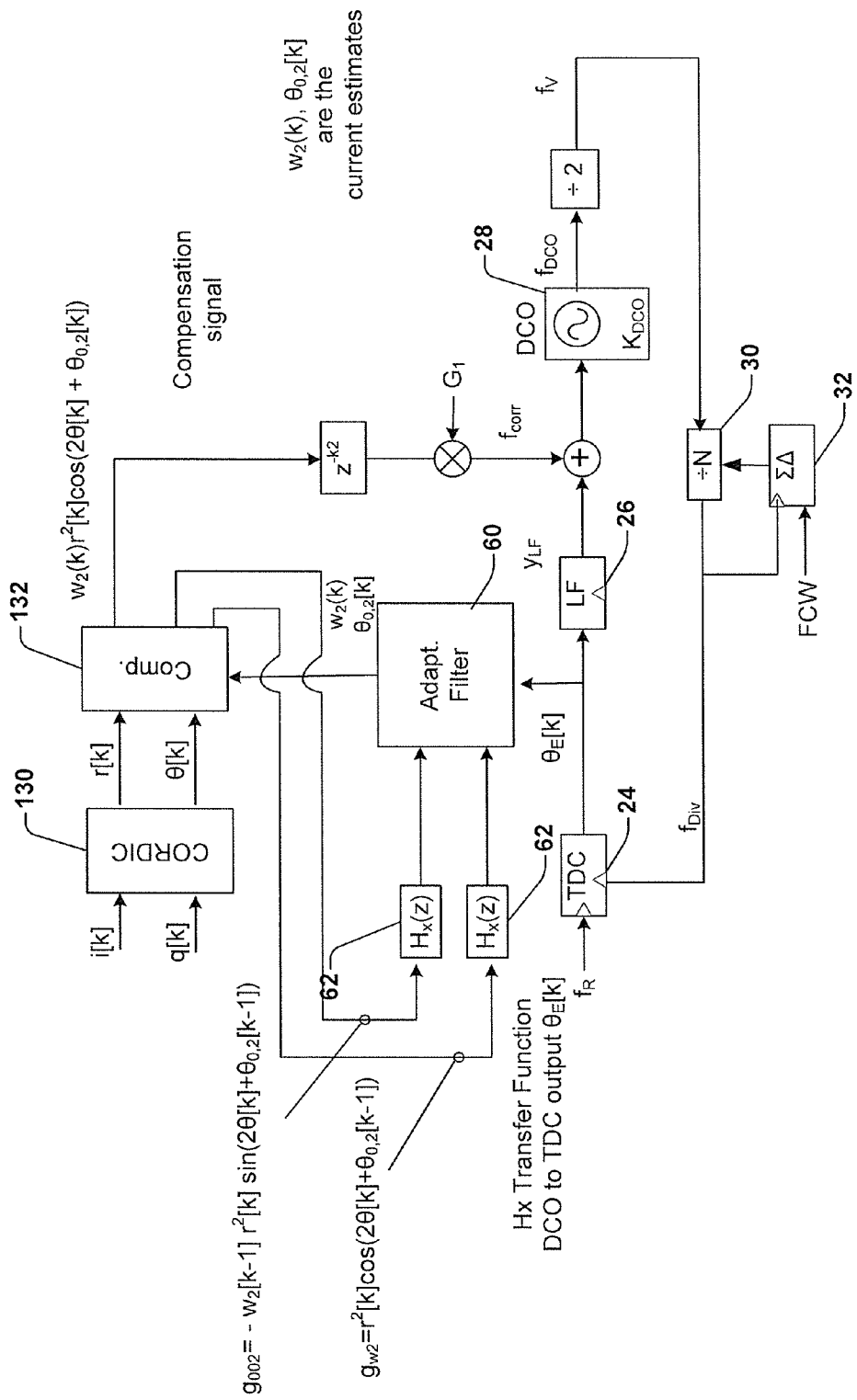

In such a case, when considering solely the second order coefficient $w_2$ as illustrated in FIG. 7C, the cost function J to be minimized can be characterized as:

$$J(w_2,\theta_{0,2}) = e^2(w_2,\theta_{0,2}) = (f_{dist} * h_v[k] - w_2 \cdot r[k]^2 \cos(2\theta(t)+\theta_{0,2}) * h_x[k])^2 \quad \text{Eq. 59}$$

where $f_{dist} * h_v$ represents the frequency distortion induced due to the pulling at the TDC output 24, $\theta(t)$ represents the modulating phase and $\theta_{0,2}$ is the unknown phase offset and $w_2$ is the unknown gain coefficient. The hardware architecture to compute the optimal unknown parameters $w_2, \theta_{0,2}$ can be derived as follows. First, the gradients of the cost function $J(w_2,\theta_{0,2})$ respect to the unknown parameters are computer, i.e. $\nabla J_{w2} = de^2/dw_2$ and $\nabla J_{\theta 02} = de^2/d\theta_{0,2}$.

The gradient respect to $w_2$ is $$\nabla J_{w2} = \frac{de^2}{dw_2} = -2e[k] \underbrace{r^2[k]\cos(2\theta(t)+\theta_{0,2}[k-1])}_{=g_{w2}[k]} * h_x[k] \quad \text{Eq. 60}$$
$$= g_{w2,fil}[k]$$

where instead of $\theta_{0,2}$ we take the previous estimate $\theta_{0,2}[k-1]$.

The gradient respect to $\theta_{0,2}$ is $g_{\theta 0,2}$ $$\nabla J_{\theta 0,2} = \frac{de^2}{d\theta_{0,2}} = 2e[k] \underbrace{w_2[k-1]r^2[k]\sin(2\theta(t)+\theta_{0,2}[k-1])}_{g_{\theta 2}[k]} * h_x[k] \quad \text{Eq. 61}$$
$$= g_{\theta 2,fil}[k]$$

where instead of $\theta_{0,2}$ we take the previous estimate $\theta_{0,2}[k-1]$ and for $w_2$ we take also the previous estimate $w_2[k-1]$.

Note that instead of choosing the previous estimate, we could also have chosen the $k_0$-previous estimate, i.e. $w_i[k-k_0], \theta_{0,i}[k-k_0]$ or the any function of the previous estimates such as the mean or a moving average of the estimate.

The two unknown parameters $w_2$ and $\theta_{0,2}$ are updated according the LMS algorithm by the recursive equations given as $$w_2[k] = w_2[k-1] - \mu_{w2} \cdot \nabla J_{w2} \quad \text{Eq. 62}$$

$$w_2[k] = w_2[k-1] - \mu_{w2} \cdot e[k] r[k]^2 \cos(2\theta[k] + \theta_{0,2}[k-1]) * h_x[k] \quad \text{Eq. 63}$$

$$\theta_{02}[k] = \theta_{02}[k-1] - \mu_{\theta 02} \cdot \nabla J_{\theta 2} \quad \text{Eq. 64}$$

In reference to FIG. 7C, the computation of optimal coefficients according Eq. 62-64 is accomplished inside the adaptive filter unit 60.

It will be appreciated that solving for the first order coefficient $w_1$ can be handled in an analogous fashion. Obviously we could also use signed LMS, for example $$w_2[k] = w_2[k-1] - \mu_{w_2} 2 \, \text{sign}(e[k]) \text{sign}(r_k^2 \cos(2\theta_k + \theta_{0,2}[k-1]) * h_x[k])$$ Eq. 65 or any other kind of flavor which might be used in practical applications to reduce the hardware effort.

To summarize, FIG. 7B illustrates an alternative example, wherein the adaptive filter 60 provides the estimates $w_1$, $w_2$, $\theta_{0,1}$, $\theta_{0,2}$, which are fed as inputs to a computation block 132. In contrast, in FIG. 7A, the adaptive filter 60 generates the estimates and the correction signal which is injected into the DCO input. FIG. 7C is another alternative example that is similar to FIG. 7B, but does not employ the linear, first-order coefficient $w_1$ and $\theta_{0,1}$.

In one example, the compensation unit 52 of FIG. 2 is configured to operate with two phases, an estimation phase and a pre-distortion phase. During the estimation phase, in one example the compensation unit 52 utilizes a magnitude ramp portion of a frame and instantaneous frequency deviation values to estimate phase modulation distortions, including those introduced into the phase modulation signal from the amplitude modulation path, also referred to as the amplitude modulation to frequency modulation effects. These effects include second order distortions, such as those described supra.

A magnitude ramp is present during certain types of frame configurations, such as GFSK modulation. The "instantaneous" frequency deviation values or samples are provided by the DPLL 22 via the output of the TDC 24 (see FIG. 3). The samples can be provided in the form of the frequency deviation signal. A distortion effect results from frame transmission conditions including, but not limited to, frequency channel, max power, temperature, chip process, and the like. The compensation unit 52 utilizes the estimated distortion to pre-distort the phase modulation signal by providing the frequency compensation or correction signal to the summation component 36 of FIGS. 2 and 3, for example. It is also noted that in accordance with one example the time delay of the frequency compensation signal is adjusted to a delay of the envelope signal path so that the frequency compensation signal 56 is aligned in time with respect to the output signal provided at the mixer 38 of FIGS. 2 and 3.

In one example, the estimated distortion is calculated for each frame. However, the inventor of the present disclosure has recognized that a training or ramp portion of subsequent frames may be substantially similar to a current or previous frame. Thus, in another example, the estimated distortion is reused for a period of time or a selected number of frames to mitigate power consumption and computation.

Figure 8:
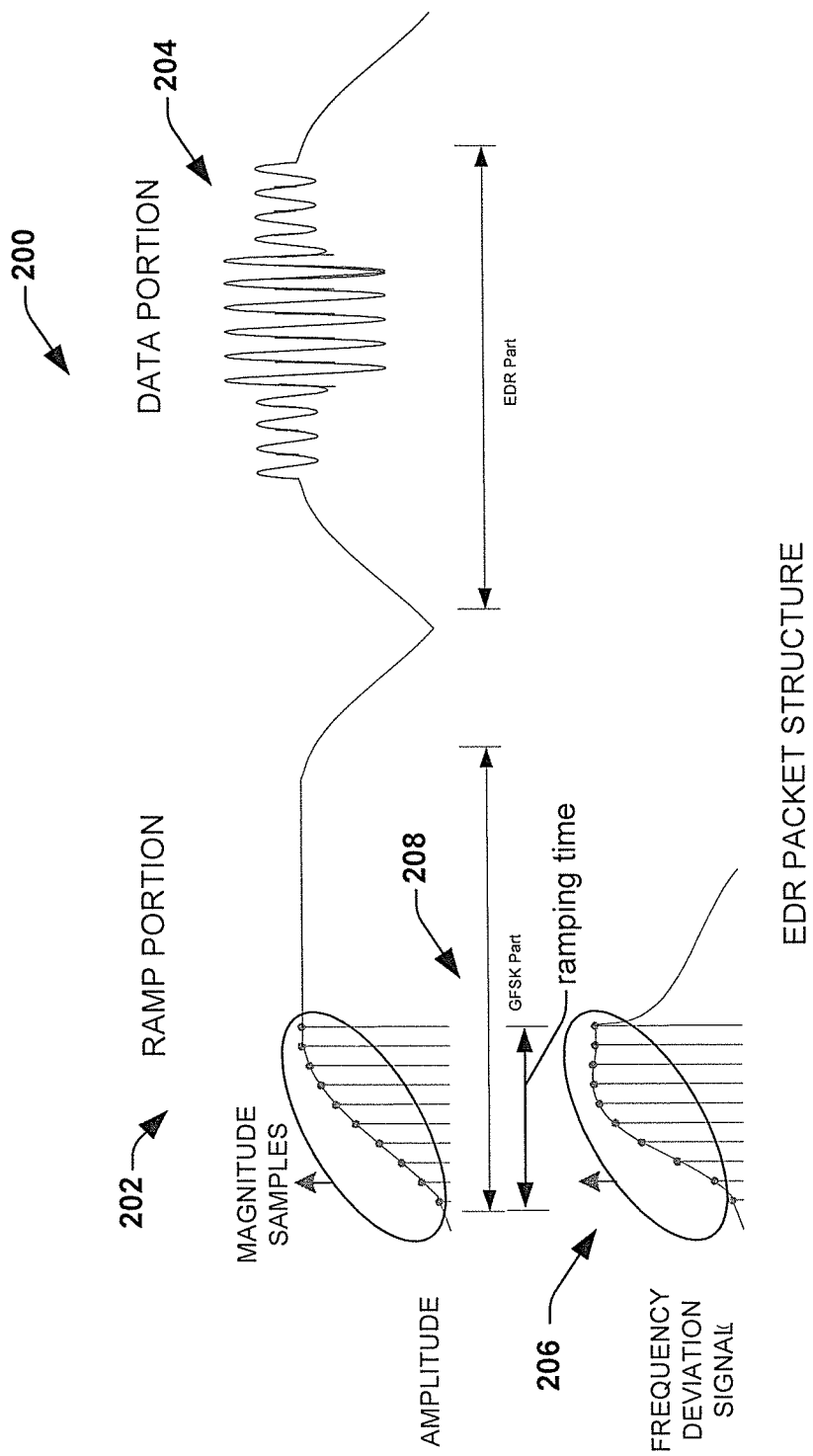
FIG. 8 is a timing diagram illustrating an EDR packet structure and how the transmitter can employ a ramp portion of the packet to perform the estimation for generating the compensation signal.

FIG. 8 is a graph showing an example of a frame 200 that can be utilized to mitigate unwanted error or distortions. The example frame 200 shown is an enhanced data rate (EDR) frame according to the Bluetooth standard, however, the present disclosure is not limited to this example. The frame 200 includes a training or ramp portion 202 and a data portion 204. The ramp portion 202 is a GFSK ramp in this example. The data portion 204 is an EDR portion. Additionally, the graph shows frequency deviation values 206. It can be seen that the ramp portion 202 includes a sweep of magnitude values. The ramp 202 in the illustrated example includes a smooth, controlled increase of magnitude or transmission power over a selected period of time. In a similar way, for a GSM/EDGE system the estimation could be accomplished during the power ramping of the GSM-EDGE burst.

In one example, the ramp portion could be used as a training sequence to determine the optimal coefficient according to the least problem $e^2[k] = (f_{dist}[k] * h_y[k] - G_1 w_2 r^2[k] * h_x[k])^2$. During the training sequence the correction signal $f_{corr}$ is first set to zero. The ramping of the power will induce a frequency distortion which is perceived at the TDC output and these samples are fed to the adaptive filter given as the sequence $f_{dist}[k] * h_y[k]$. For the second input of the adaptive filter in 60 the signal $r^2[k] * h_x[k]$ is aligned in time respect to the distortion signal which is the purpose of the delay cell $z^{-k_1}$ shown in FIG. 6. Applying the least squares estimation method, as shown above, yields the optimal coefficient $w_{2,opt}$. The correction signal $f_{corr} = G_1 w_{2,opt} r^2[k]*$ which is also aligned in time by the adjustable delay $z^{-k_2}$ as shown in FIG. 6, such that it matches the distortion signal respect to time, is then applied to the DCO input with the start of the non-constant envelope portion of the packet, namely the EDR-portion.

While the ramp portion 202 advantageously provides for an estimate of induced oscillator frequency distortions and accounts for the time variant of the system due to temperature variations, voltage an antenna impedance, etc., in some instances a number of samples for the frequency estimation process may be limited due to a short time duration for the available ramping time 208.

In another example of the present disclosure, a sinusoidal amplitude modulated signal is employed as a training sequence to measure the amount of induced frequency distortion. The estimation is then accomplished using the adaptive filter 60 and algorithm to ascertain the coefficient(s) of a polynomial function of arbitrary order that minimizes a cost function.

Figure 9:
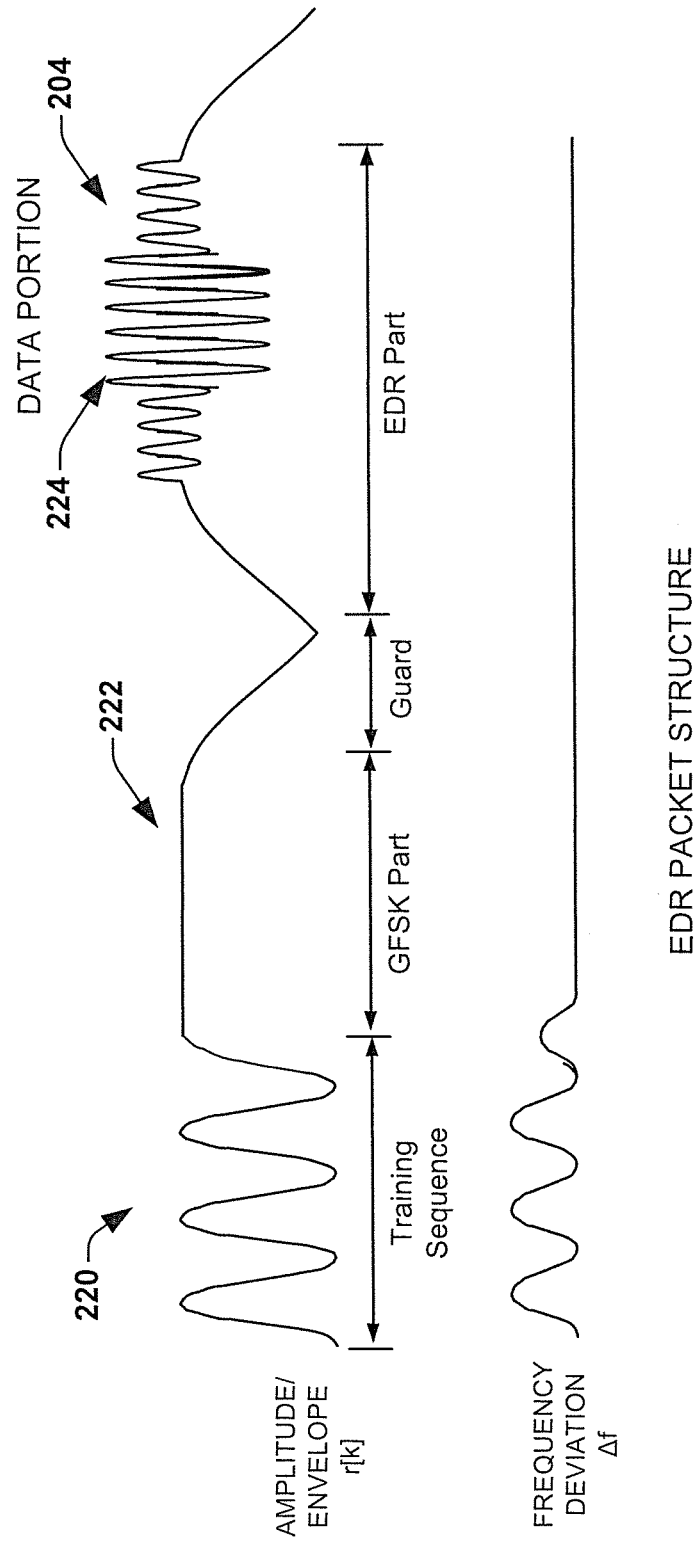
FIG. 9 is a timing diagram illustrating an EDR packet structure that appends a sinusoidal training sequence at a front of the packet for use in performing the estimation for generating the compensation signal.

Turning to FIG. 9, an EDR packet structure is illustrated, wherein a training sequence 220 is appended before the GFSK part 222 of the packet structure. The sinusoidal training sequence 220 may then be employed as the amplitude data for use in estimating the induced frequency distortion. In one example an envelope of the sinusoidal training sequence 220 is chosen such that its instantaneous peak matches a peak value of the AM modulation 224 during the active packet transmission, which in this particular example is the data portion or EDR part of the packet structure in FIG. 9. As can be seen, the number of samples available for estimation in the training sequence 220 may be substantially greater than in the relatively shorter ramp portion time duration of FIG. 8. This helps improve an accuracy of the estimation of the induced frequency distortion due to the modulation.

In one example, the sinusoidal training sequence 220 is employed before each transmit packet in order to perform the correlation over a sufficiently long time interval. In the Bluetooth standard, no restriction exists on the shape of the power versus time trajectory as long as spurious emission requirements are not violated. Thus a training sequence 220 may be employed before each transmit packet. Alternatively, a training sequence 220 may be selectively inserted before a packet according to some predetermined schedule or before every N packets to increase packet transmission throughput and reduce power consumption.

In other applications such as WiFi or UMTS, the estimation process could be performed during the short training field (STF), long training field (LTF) and legacy signal fields (L-SIG) of the WiFi packet. During the payload the estimation could be continuously updated to track variations along the transmission or alternatively, the result of the estimation could be frozen before the beginning of the payload such that the coefficients of the correction signal remain constant over the payload. Alternatively, a tracking mode could be engaged, in which the coefficients are slowly updated to track small variations. A similar approach could be used for UMTS.

Figure 10:
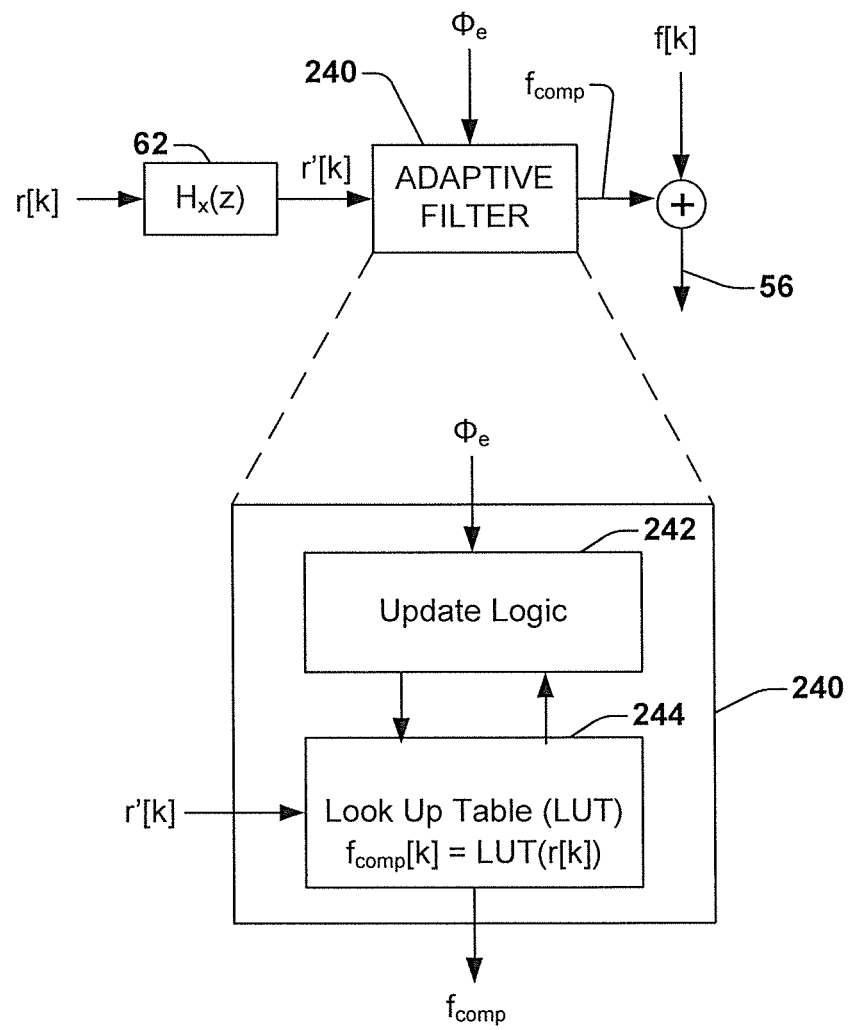
FIG. 10 is a block diagram illustrating that the adaptive filter can be employed as a look up table (LUT) to provide compensation coefficients for generation of the compensation signal.

In another example of the present disclosure the compensation unit 52 of FIG. 2 includes an "adaptive filter" 240 as illustrated in FIG. 10. Instead of the adaptive filter 60 of FIG. 3, which generates coefficients for a compensation signal, the adaptive filter 240 of FIG. 10 operates to provide a compensation signal $f_{comp}$ that is combined with the frequency modulation data f[k] to generate predistorted frequency modulation data 56 to be injected into the feedforward path of the DPLL.

As illustrated in FIG. 10, the adaptive filter 240 includes update logic 242 and a look up table (LUT) 244. The envelope signal r[k] (i.e., amplitude data) or the modified, or compensated, envelope signal r'[k] operates as an input to the adaptive filter 240. In one example, the envelope or magnitude data corresponds to the instantaneous address to select the appropriate compensation data, wherein $f_{corr}[k]$=LUT(r[k]) or LUT(r'[k]). Further, the filtered phase error $\phi_e$ (output of the low-pass filter 104 in FIG. 5) of the DPLL 22 is used to update the LUT entries. In one example the update of the LUT is performed at a rate of the TDC clock rate. In one example, an instantaneous error $\Delta[k]=\phi_e[k]-\phi_e[k-1]$ is multiplied by a step-size parameter $\lambda$ and used to update the table entry value at the address r[k-k0]. In one example the update logic 242 operates according to:

$$\text{LUT}(r[k-k0])=\text{LUT}([k-k0])+\lambda(\phi_e[k]-\phi_e[k-1]).\qquad \text{Eq. 66}$$

In one example the parameter $\lambda$ controls a step size moving on an error surface and can be implemented as a time-varying parameter which may operate to compensate for large frequency errors early in the estimation process while allowing for small variations of the LUT entries after a predetermined convergence has been reached. In one example it is desirable for the compensating signal $f_{corr}[k]$ to be aligned in time with respect to the transmit carrier signal and thus tuning a time delay of the compensating signal path to substantially align with the envelope signal path is contemplated by the present disclosure.

In another example of the disclosure, the table entries of the LUT 244 may be updated based on the sign of the TDC output, wherein sign($\phi[k]-\phi[k-1]$).

Figure 11A:
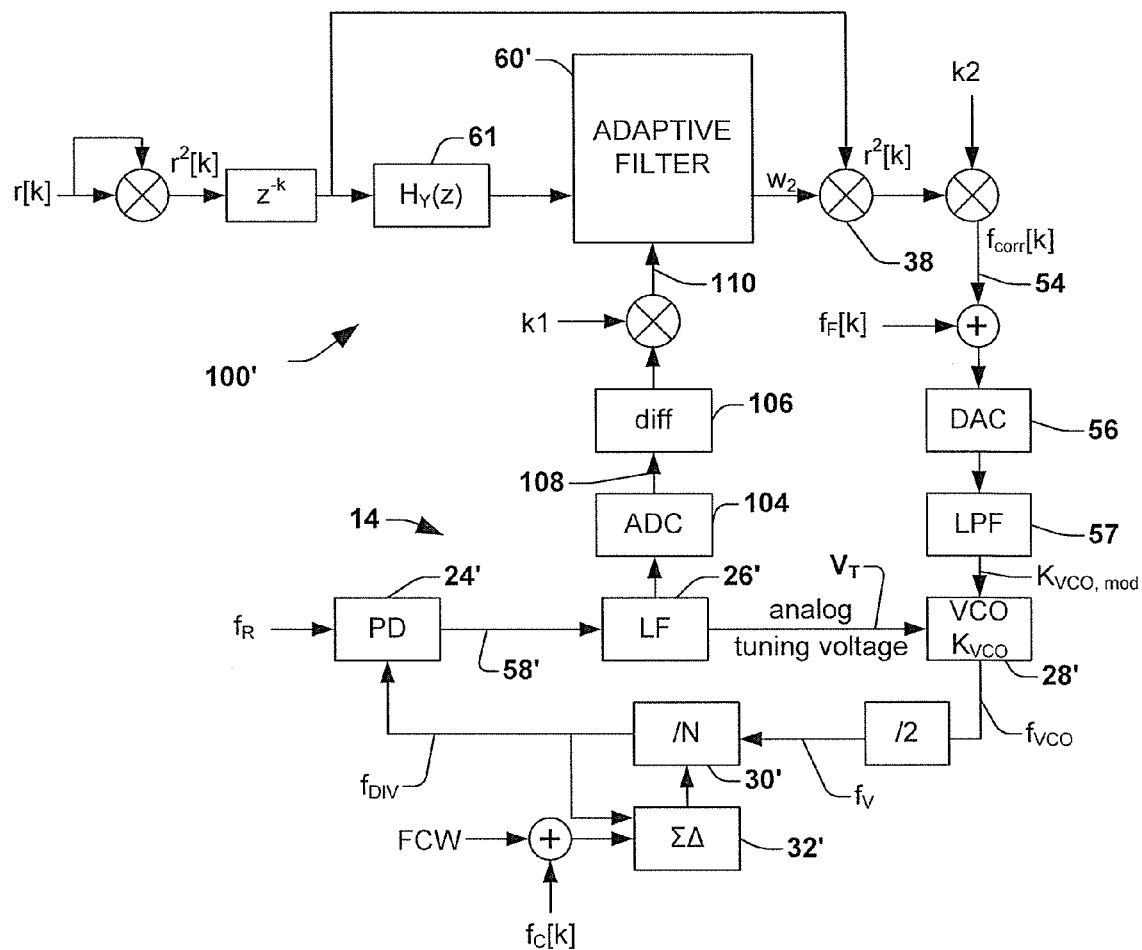
FIGS. 11A-11B are block diagrams illustrating a transmitter employing a polar modulator architecture having a distortion compensation unit in conjunction with an analog phase locked loop (APLL).
Figure 11B:
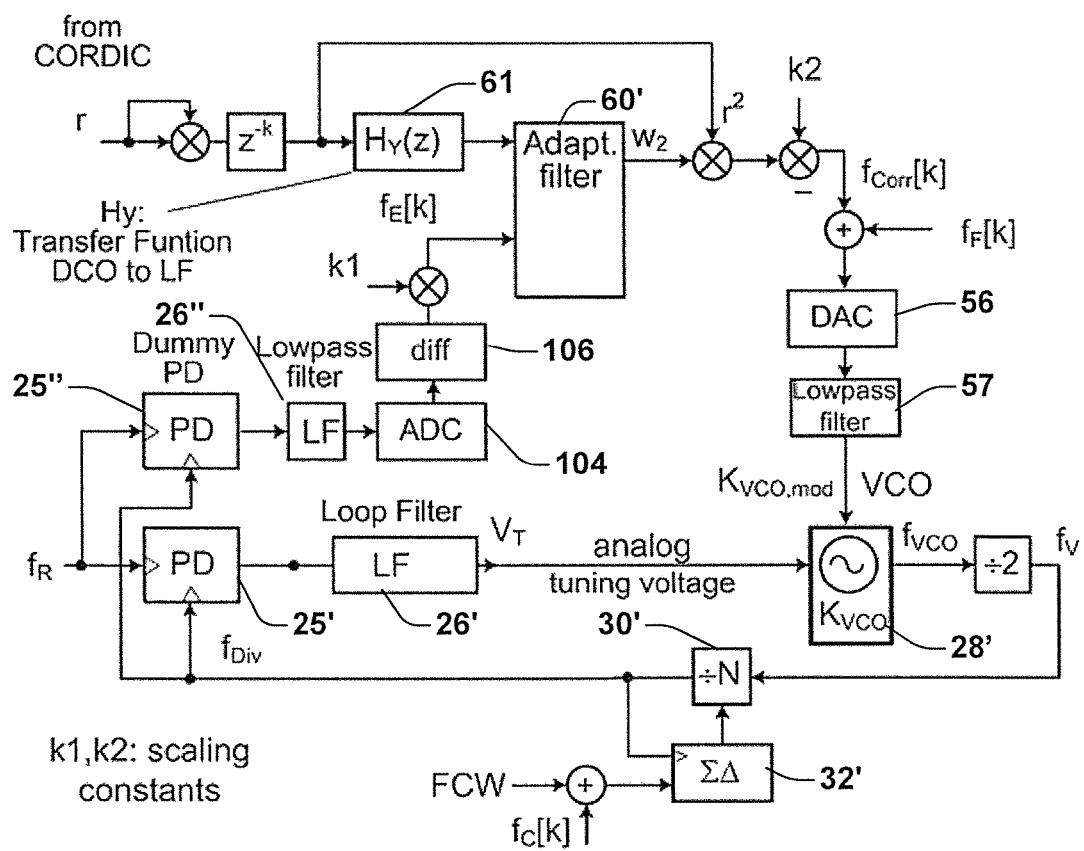

While FIGS. 2A, 3A and 5-6, for example, are directed to polar modulator architectures employing a digital phase locked lop (DPLL), it should be appreciated that the various advantageous features highlighted therein are equally applicable to a polar modulator architecture employing an analog phase locked loop (APLL). FIGS. 11A-11B illustrate two examples according to the present disclosure.

Referring initially to FIG. 11A, an analog phase locked loop 14' has a primary path that includes a phase detector (PD) 24', a loop filter (LF) 26', and a voltage controlled oscillator (VCO) 28'. The APLL 14' further includes a feedback path that includes a programmable divider 30' driven by a sigma delta modulator 32'. The APLL 14' operates by comparing a phase of a reference signal $f_R$ to a phase of a feedback signal $f_{DIV}$ and outputting an error signal 58' that reflects an error signal that represents an amount of deviation between the reference signal and the feedback signal. The error signal 58' is utilized by the loop filter 26' to generate an analog tuning voltage $v_T$ that is input to the voltage controlled oscillator 28', which then alters a frequency of its output signal $f_{VCO}$ based on the analog tuning voltage $v_T$ in order to minimize the error signal 58'.

In the same manner as described above in FIGS. 2A-2B, for example, distortion that is injected into the DCO 28 is similarly injected into the VCO 28'. Such distortion is estimated via a compensation circuit 100' as illustrated in FIG. 11A, wherein an adaptive filter 60' operates to generate compensation data 54' that is converted to analog data at DAC 56, filtered at LPF 57 and injected into the VCO 28' to compensate for such distortion. In one example, the error 58' is passed via the loop filter 26' to an ADC 104' to convert the error data into digital format, wherein the compensation circuit 100' performs the compensation calculations in a digital fashion, for example, in a manner similar to that described above in the earlier examples.

FIG. 11B is an alternative example of an analog phase locked loop polar transmitter architecture. In FIG. 11B, a dummy phase detector 25" receives both the reference signal $f_R$ and the feedback signal $f_{DIV}$ (along with the standard phase detector 25, as illustrated) and generates an error signal that is filtered, converted to digital, and differentiated for use by the adaptive filter 60' in a manner similar to that shown in FIG. 11A. In FIG. 11B, the error data is used from the substantially identical phase detector 25" to provide for less delay in the primary path of the ADLL.

There are several advantages associated with the employing a dummy path as provided in FIG. 11B. For example, one advantage stems from the fact that the bandwidth of the lowpass filter 26" can be chosen independently from the loopfilter 26' bandwidth. The loopfilter 26' bandwidth of the PLL is usually constrained by noise and hence requires a narrow corner frequency, typically around 100 kHz. The bandwidth of the lowpass filter 26", on the other hand, is usually much larger such that a distortion signal experienced by the oscillator can be measured without being attenuated by the lowpass filter 26".

Figure 13B:
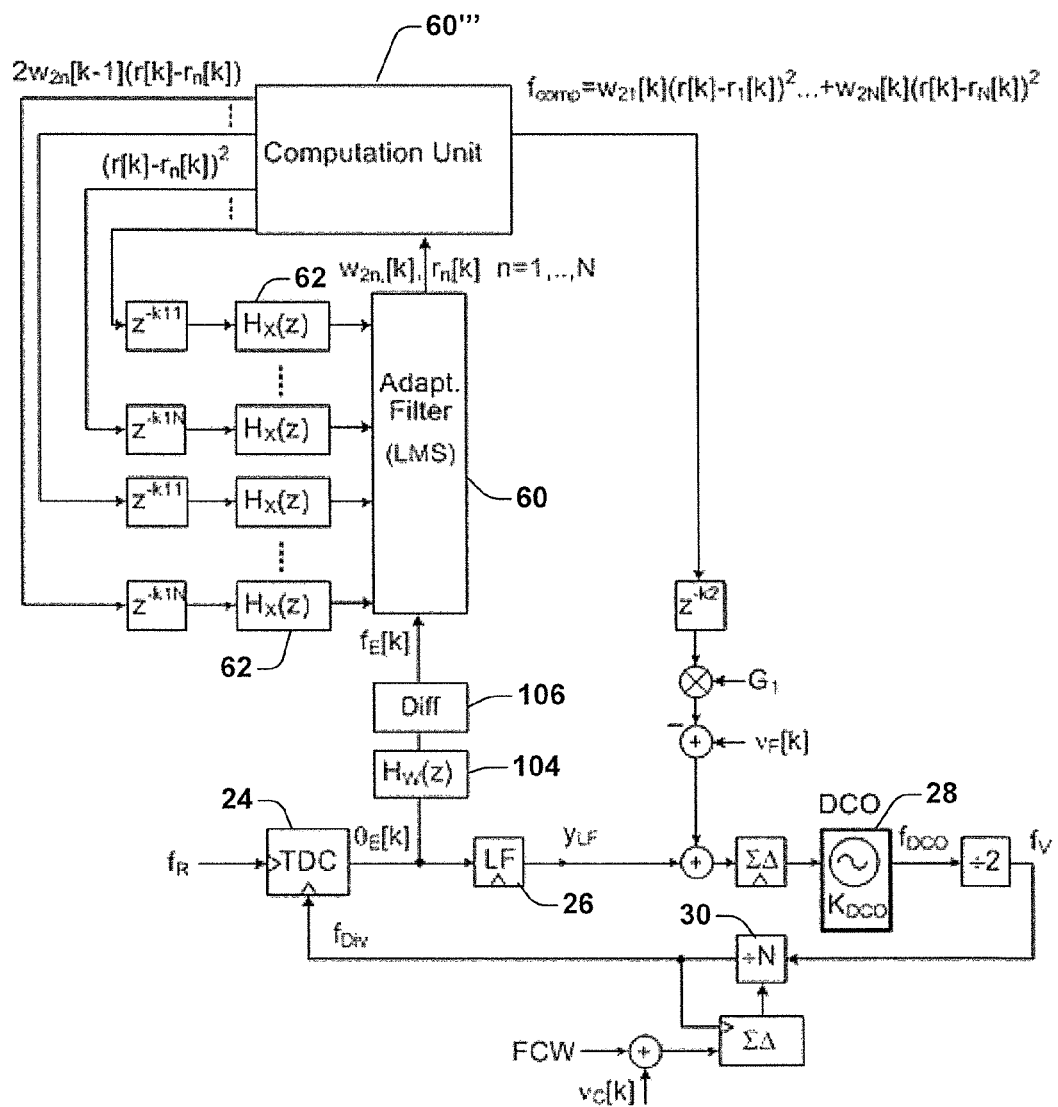

Referring now to FIG. 13A, a digital phase locked loop (DPLL) illustrated, that operates similar to previous DPLL examples. In this example, the adaptive filter 60 compensates for DCO frequency distortion effects through an N-path (N=2 in FIG. 13A and N=4 in FIG. 13B) second harmonic coupling. The compensation signal $f_{comp}$ is characterized in this example as:

$$f_{comp}=w_{12}(r-r_{12})^2+w_{22}(r-r_{22})^2,$$

where r is the envelope signal, $r_{12}$ and $r_{22}$ are two unknown offsets, and $w_{12}$ and $w_{22}$ are unknown coefficients. The cost function which is to be minimized in the adaptive algorithm in the filter 60 is written in this example as follows:

$$\min_{\substack{w_{12},w_{22}\\r_{12},r_{22}}} e^2 = (f_D - f_{comp}*h_x)^2$$

where $f_D$ is the frequency distortion measured at the TDC output and hx is the inpulse transfer function from the DCO to the TDC output, and "*" represents the convolution operator. The function can be solved in numerous ways, and one example comprises a non-linear least square estimation technique.

Figure 14:
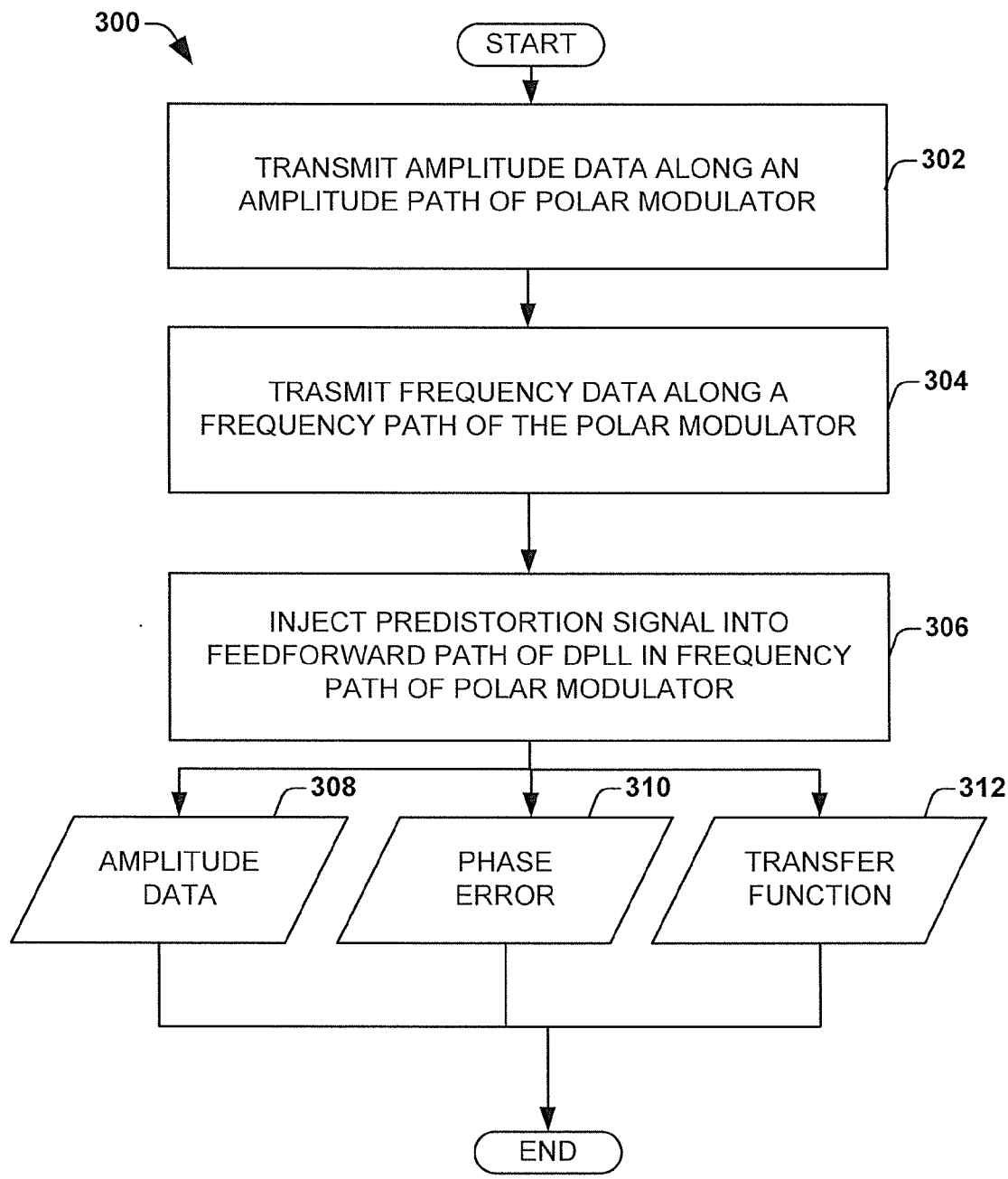
FIG. 14 is a flow chart diagram illustrating a method of minimizing distortion in a frequency path of a polar transmitter caused by parasitic coupling from an amplitude modulation path thereof.

Turning to FIG. 14, a flow chart is provided that illustrated a method 300 of minimizing or otherwise eliminating substantially distortion in a frequency modulation path due to distortion caused by parasitic coupling from an amplitude modulation path in a polar transmitter. While the above method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or examples of the disclosure herein. Also, one or more of the acts depicted herein may be carried out in one or more separate acts and/or phases.

The method 300 begins at 302, wherein amplitude data comprising an amplitude envelope is transmitted along an amplitude path of the polar transmitter. In one example, the polar modulator may comprise an architecture similar to that illustrated in FIGS. 2 and 3, however, other type architectures may be employed and such alternatives are contemplated as falling within the scope of the present disclosure. In such an instance the amplitude envelope r[k] is transmitted along the amplitude path 12. Further, at 304, the method 300 continues, wherein frequency data is transmitted along a frequency path 14 of the polar modulator. For example, in the example of FIG. 2, frequency data includes the carrier frequency signal in the feedback path of the DPLL 22, the error signal at the output of the TDC, and/or the frequency modulation signal 56 injected into the feedforward path of the DPLL. The method 300 then continues at 304, wherein a predistortion signal in injected into a tuning input of the DPLL which resides in the frequency path of the polar modulator. According to one example of the disclosure, the predistortion signal is based on induced distortions due to amplitude data 308, phase or frequency error data 310, wherein the error signal reflects an impact of a transfer function from the DCO to the output of the TDC in the DPLL. The predistortion signal combines with the frequency modulation data to create predistorted frequency modulation data that compensates for the measured induced distortions, thereby providing decreased distortion at the transmitter output.

In one example, the generation of the predistortion signal at 306 comprises receiving the amplitude data, receiving the error data, and processing the amplitude data and the error data in an adaptive filter to generate one or more polynomial coefficients of a polynomial that characterizes the predistortion signal.

In one example of the disclosure the transfer function is taken into account via a compensation filter that modifies the amplitude data based on the measured effects of the transfer function in the DPLL on the frequency distortion.

In another example of the disclosure, the method 300 further comprises filtering the error data in the frequency modulation path of the DPLL to remove high frequency components and improve the estimation of error coefficients in an adaptive filter for generating a compensation signal.

A transmitter comprises an amplitude modulation path, and a frequency modulation path including a digital phase locked loop (DPLL) comprising a digitally controlled oscillator (DCO) and a time to digital converter (TDC). The transmitter further comprises an amplitude to frequency distortion compensation unit configured to generate a compensation signal based on amplitude data from the amplitude modulation path, and error data based on an output of the TDC. The amplitude data is filtered by a transfer function that models a transfer function from the DCO to the output of the TDC, and further configured to provide the compensation signal to a node in a feedforward path of the DPLL, for example, a tuning input of the DCO.

In the above transmitter the amplitude to frequency distortion compensation unit comprises a conditioning filter configured to receive the amplitude data and output conditioned amplitude data. In one example the amplitude to frequency distortion compensation unit further comprises an adaptive filter configured to receive the conditioned amplitude data and the error data based on the output of the TDC, and generate one or more compensation coefficients used for generating the compensation signal.

Still referring to the above transmitter, the amplitude to frequency distortion compensation unit further comprises a smoothing filter configured to receive error data output from the TDC and generate filtered error data having high frequency noise removed therefrom. In one example, the error data comprises phase error data, and the amplitude to frequency distortion compensation unit further comprises a differentiation component configured to differentiate the filtered phase error data to generate filtered frequency error data.

In one example the amplitude to frequency distortion compensation unit further comprises an adaptive filter configured to receive the conditioned amplitude data and filtered frequency error data, and generate one or more compensation coefficients used for generating the compensation signal.

In the transmitter set forth above, the amplitude to distortion compensation unit is configured to generate the compensation signal using a training sequence before an actual packet transmission by the transmitter. In one example the training sequence comprises a sinusoidal function, wherein the sinusoidal function training sequence induces a frequency deviation associated with the TDC, and wherein the induced frequency deviation comprises the error data.

In one example of the transmitter set forth above, the compensation signal comprises a polynomial predistortion signal $w_1 r + w_2 r^2 + \ldots + w_n r^n$, wherein $w_1, w_2, \ldots, w_n$ are polynomial coefficients that are estimated by minimizing a cost function, and r is the envelope of the amplitude data in the amplitude modulation path. In one example the amplitude to frequency distortion compensation unit is configured to update the polynomial coefficients continuously or on a periodic basis and provide the compensation signal during an operation of the transmitter.

In one example of the transmitter, the error data comprises a normalized tuning word output from a loop filter in the feedforward path of the DPLL.

In accordance with another example, a transmitter is disclosed which comprises in-phase (I) and quadrature (Q) paths containing in-phase (I) data and quadrature (Q) data, respectively. The transmitter further includes a conversion circuit configured to convert the I-data and the Q-data into amplitude data and phase data, and a frequency modulation path including a digital phase locked loop (DPLL) comprising a digitally controlled oscillator (DCO) and a time to digital converter (TDC). The transmitter further comprises an amplitude to frequency distortion compensation unit configured to generate a compensation signal based on the amplitude data and the phase data from the amplitude modulation path, and error data based on an output of the TDC, and wherein the amplitude data and the phase data is filtered by a transfer function that models a transfer function from the DCO to an output of the TDC, and further configured to provide the compensation signal to a node in a feedforward path of the DPLL, for example, a tuning input of the DCO.

In one example the amplitude to frequency distortion compensation unit comprises an adaptive filter configured to receive filtered amplitude data based on compensation for the impact of the transfer function and the error signal, and output one or more polynomial coefficients that characterize the predistortion signal as a polynomial equation. In one example the adaptive filter is configured to generate the one or more polynomial coefficients by minimizing a cost function characterized by an error between a distortion in the error signal and the polynomial equation.

In the above transmitter the error signal comprises a phase error signal, and the amplitude to frequency distortion compensation unit further comprises a smoothing filter configured to receive the phase error signal and output a filtered phase error signal having a high frequency signal components removed therefrom. In one example the amplitude to frequency distortion compensation unit further comprises a differentiation component configured to differentiate the filtered phase error signal and output a filtered frequency error signal.

In one example the amplitude to frequency distortion compensation unit further comprises an adaptive filter configured to receive filtered amplitude data based no compensation for the impact of the transfer function and the filtered frequency error signal, and output one or more polynomial coefficients that characterize the predistortion signal as a polynomial equation.

In one example the amplitude to frequency distortion compensation unit is configured to generate the predistortion signal using a training sequence before an actual packet transmission by the transmitter. The training sequence comprises a sinusoidal function that induces a frequency deviation associated with the TDC, and wherein the induced frequency deviation comprises the error signal.

In yet another example of the present disclosure, a method of minimizing distortion in a frequency modulation path due to phase modulation distortion caused by parasitic coupling from an amplitude modulation path in a polar transmitter is disclosed. The method comprises transmitting amplitude data comprising an amplitude envelope along the amplitude path, and transmitting frequency data along the frequency modulation path comprising a digital phase locked loop (DPLL) having a time to digital converter (TDC) and a digitally controlled oscillator (DCO) in a feedforward path, and a feedback path.

The method further comprises injecting a predistortion signal into the feedforward path of the DPLL, wherein the predistortion signal is based on induced distortions in an error signal output from the TDC due to amplitude data in the amplitude modulation path, wherein the error signal reflects an impact of a transfer function from the DCO to the TDC on the amplitude data.

In one example generating the predistortion signal comprises receiving the amplitude data, receiving the error data, and processing the amplitude data and the error data in an adaptive filter to generate polynomial coefficients of a polynomial that characterizes the predistortion signal.

In one example processing the amplitude data further comprises passing the amplitude data through a conditioning filter to generate processed amplitude data that reflects an impact of the output of the transfer function between the DCO and the output of the TDC on the amplitude data.

In another example of the method, the predistortion signal comprises a polynomial predistortion signal $w_1 r + w_2 r^2 + \ldots + w_n r^n$, wherein $w_1, w_2, \ldots, w_n$ are polynomial coefficients that are estimated by minimizing a cost function, and r is the envelope of the amplitude data in the amplitude modulation path. Generating the predistortion signal may further comprise filtering the error data with a smoothing filter to generate filtered error data having high frequency noise removed therefrom, and using the filtered error data in the adaptive filter to generate the polynomial coefficients.

In one example of the method the error data comprises phase error data. In such instance the method further comprises differentiating the filtered phase error data downstream of the smoothing filter to form filtered frequency error data, and using the filtered frequency error data in the adaptive filter to generate the polynomial coefficients.

In one example the generating the predistortion signal is performed prior to an actual packet transmission using a training sequence to generate the amplitude data and error data.

In another example, a transmitter is provided that comprises an amplitude modulation path and a frequency modulation path including an analog phase locked loop (APLL) that comprises a voltage controlled oscillator (VCO) and a phase detector (PD). The transmitter further comprises an amplitude to frequency distortion compensation unit configured to generate a compensation signal based on amplitude data from the amplitude modulation path, and error data based on an output of the PD. The amplitude data is filtered by a transfer function that models a transfer function from the VCO to an output of the PD, and further configured to provide the compensation signal to a node in a feedforward path of the APLL, for example, a tuning input of the VCO.

In another example, a transmitter is disclosed and comprises in-phase (I) and quadrature (Q) paths containing in-phase (I) data and quadrature (Q) data, respectively, and a conversion circuit configured to convert the I-data and the Q-data into amplitude data and phase data. The transmitter further comprises a frequency modulation path including an analog phase locked loop (APLL) that comprises a voltage controlled oscillator (VCO) and a phase detector (PD) and an amplitude to frequency distortion compensation unit configured to generate a compensation signal based on the amplitude data and the phase data from the amplitude modulation path, and error data based on an output of the PD. The amplitude data and the phase data are filtered by a transfer function that models a transfer function from the VCO to an output of the PD, and further configured to provide the compensation signal to a node in a feedforward path of the APLL, for example, a tuning input of the VCO.

In one example, a transmitter is disclosed and comprises an amplitude modulation path and a frequency modulation path including a phase locked loop (PLL) comprising a controllable oscillation means and a phase detection means. The transmitter further comprises an amplitude to frequency distortion compensation means configured to generate a compensation signal based on amplitude data from the amplitude modulation path, and error data based on an output of the phase detection means. The amplitude data is filtered by a transfer function that models a transfer function from the controllable oscillation means to an output of the phase detection means. The amplitude to frequency distortion compensation means is further configured to provide the compensation signal to a node in a feedforward path of the PLL.

In another example, a transmitter comprises in-phase (I) and quadrature (Q) paths containing in-phase (I) data and quadrature (Q) data, respectively, and a conversion means configured to convert the I-data and the Q-data into amplitude data and phase data. The transmitter further comprises a frequency modulation path including a phase locked loop (PLL) comprising a controllable oscillation means and a phase detection means, and an amplitude to frequency distortion compensation means. The amplitude to frequency distortion compensation means is configured to generate a compensation signal based on the amplitude data and the phase data from the amplitude modulation path, and error data based on an output of the phase detection means. The amplitude data and the phase data is filtered by a transfer function that models a transfer function from the controllable oscillation means to an output of the phase detection means, and the amplitude to frequency distortion compensation means is further configured to provide the compensation signal to a node in a feedforward path of the PLL.

A system for minimizing distortion in a frequency modulation path due to phase modulation distortion caused by parasitic coupling from an amplitude modulation path in a polar transmitter comprises means for transmitting amplitude data comprising an amplitude envelope along the amplitude path, and means for transmitting frequency data along the frequency modulation path comprising a phase locked loop (PLL) having a phase detector and a controllable oscillator, and a feedback path. The system further comprises means for injecting a predistortion signal into a tuning input of the controllable oscillator, wherein the predistortion signal is based on induced distortions in an error signal output from the phase detector due to amplitude data in the amplitude modulation path. The error signal reflects an impact of a transfer function from the controllable oscillator to the output of the phase detector on the frequency distortion.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A transmitter, comprising:
   an amplitude modulation path;
   a frequency modulation path including a phase locked loop (PLL) comprising a controllable oscillator and a phase detector; and
   an amplitude to frequency distortion compensation unit configured to generate a compensation signal based on amplitude data from the amplitude modulation path, and error data based on an output of the phase detector, and wherein the amplitude data is filtered by a transfer function that models a transfer function from the controllable oscillator to an output of the phase detector, and further configured to provide the compensation signal to a node in a feedforward path of the PLL,
   wherein the amplitude to distortion compensation unit is configured to generate the compensation signal using a training sequence before an actual packet transmission by the transmitter.

2. The transmitter of claim 1, wherein the amplitude to frequency distortion compensation unit comprises a conditioning filter configured to receive the amplitude data and output conditioned amplitude data.

3. The transmitter of claim 2, wherein the amplitude to frequency distortion compensation unit further comprises a smoothing filter configured to receive error data output from the phase detector and generate filtered error data having high frequency noise removed therefrom.

4. The transmitter of claim 3, wherein the error data comprises phase error data, and wherein the amplitude to frequency distortion compensation unit further comprises a differentiation component configured to differentiate the filtered phase error data to generate filtered frequency error data.

5. The transmitter of claim 4, wherein the amplitude to frequency distortion compensation unit further comprises an adaptive filter configured to receive the compensated amplitude data and filtered frequency error data, and generate one or more compensation coefficients used for generating the compensation signal.

6. The transmitter of claim 1, wherein the training sequence comprises a sinusoidal function, wherein the sinusoidal function training sequence induces a frequency deviation associated with the phase detector, and wherein the induced frequency deviation comprises the error data.

7. The transmitter of claim 1, wherein the compensation signal comprises a polynomial predistortion signal $w_1 r + w_2 r^2 + \ldots + w_n r^n$, wherein $w_1, w_2, \ldots, w_n$ are polynomial coefficients that are estimated by minimizing a cost function, and r is the envelope of the amplitude data in the amplitude modulation path.

8. A transmitter, comprising:
   an amplitude modulation path;
   a frequency modulation path including a phase locked loop (PLL) comprising a controllable oscillator and a phase detector; and
   an amplitude to frequency distortion compensation unit configured to generate a compensation signal based on amplitude data from the amplitude modulation path, and error data based on an output of the phase detector, wherein the amplitude to frequency distortion compensation unit comprises:
      a compensation filter configured to filter the amplitude data by a transfer function that models a transfer function from the controllable oscillator to an output of the phase detector, thereby generating filtered amplitude data; and
      an adaptive filter downstream of the compensation filter, and configured to receive the filtered amplitude data and the error data based on the output of the phase detector, and generate one or more compensation coefficients based thereon, wherein the one or more compensation coefficients are used for generating the compensation signal to a node in a feedforward path of the PLL.

9. A transmitter, comprising:
   in-phase (I) and quadrature (Q) paths containing in-phase (I) data and quadrature (Q) data, respectively;
   a conversion circuit configured to convert the I-data and the Q-data into amplitude data and phase data;
   a frequency modulation path including a phase locked loop (PLL) comprising a controllable oscillator and a phase detector; and
   an amplitude to frequency distortion compensation unit configured to generate a compensation signal based on the amplitude data and the phase data from the amplitude modulation path, and error data based on an output of the phase detector, wherein the amplitude to frequency distortion compensation unit comprises:
      a compensation filter configured to filter the amplitude data and the phase data by a transfer function that models a transfer function from the controllable oscillator to an output of the phase detector, thereby generating filtered amplitude data and filtered phase data; and
      an adaptive filter downstream of the compensation filter, and configured to receive the filtered amplitude data, the filtered phase data and the error data based on the output of the phase detector, and generate one or more compensation coefficients based thereon, wherein the one or more compensation coefficients are used for generating the compensation signal to a node in a feedforward path of the PLL.

10. The transmitter of claim 9, wherein the adaptive filter is configured to output one or more polynomial coefficients that characterize the compensation signal as a polynomial equation.

11. The transmitter of claim 10, wherein the adaptive filter is configured to generate the one or more polynomial coefficients by minimizing a cost function characterized by an error between a distortion in the error signal and the polynomial equation.

12. The transmitter of claim 9, wherein the error signal comprises a phase error signal, and wherein the amplitude to frequency distortion compensation unit further comprises a smoothing filter configured to receive the phase error signal and output a filtered phase error signal having high frequency signal components removed therefrom.

13. The transmitter of claim 12, wherein the amplitude to frequency distortion compensation unit further comprises a differentiation component configured to differentiate the filtered phase error signal and output a filtered frequency error signal.

14. The transmitter of claim 9, wherein the amplitude to frequency distortion compensation unit is configured to generate the compensation signal using a training sequence before an actual packet transmission by the transmitter.

15. The transmitter of claim 14, wherein the training sequence comprises a sinusoidal function, wherein the sinusoidal function training sequence induces a frequency deviation associated with the phase detector, and wherein the induced frequency deviation comprises the error signal.

16. A method of minimizing distortion in a frequency modulation path due to phase modulation distortion caused by parasitic coupling from an amplitude modulation path in a polar transmitter, comprising:
transmitting amplitude data comprising an amplitude envelope along the amplitude path;
transmitting frequency data along the frequency modulation path comprising a phase locked loop (PLL) having a phase detector and a controllable oscillator, and a feedback path;
passing the amplitude data through a compensation filter to generate filtered amplitude data that accounts for an effect of a transfer function between the controllable oscillator and the phase detector on the amplitude data;
processing the filtered amplitude data and error data associated with an error signal output from the phase detector in an adaptive filter to generate polynomial coefficients of a polynomial that characterizes a predistortion signal;
injecting a predistortion signal into a tuning input of the controllable oscillator, wherein the predistortion signal is based on induced distortions in the error signal output from the phase detector due to amplitude data in the amplitude modulation path, wherein the error signal reflects an impact of a transfer function from the controllable oscillator to the output of the phase detector on the frequency distortion.

17. The method of claim 16, wherein the predistortion signal comprises a polynomial predistortion signal $w_1 r + w_2 r^2 + \ldots + w_n r^n$, wherein $w_1, w_2, \ldots, w_n$ are polynomial coefficients that are estimated by minimizing a cost function, and r is the envelope of the amplitude data in the amplitude modulation path.

18. The method of claim 16, wherein the predistortion signal comprises a polynomial predistortion signal $w_1 r \cos(\theta(t)+\theta_{01}) + \ldots w_n r^n \cos(\theta(t)+\theta_{0N})$, wherein $w_1, \ldots, w_n$ are polynomial coefficients and $\theta_{01}, \ldots, \theta_{0N}$ are phase offsets that are estimated by minimizing a cost function, and r is the envelope of the amplitude data in the amplitude modulation path.

19. The method of claim 16, wherein generating the predistortion signal further comprises filtering the error data with a smoothing filter to generate filtered error data having high frequency noise removed therefrom, and using the filtered error data in the adaptive filter to generate the polynomial coefficients.

20. The method of claim 19, wherein the error data comprises phase error data, and further comprising differentiating the filtered phase error data downstream of the smoothing filter to form filtered frequency error data, and using the filtered frequency error data in the adaptive filter to generate the polynomial coefficients.

21. The method of claim 16, wherein the generating the predistortion signal is performed prior to an actual packet transmission using a training sequence to generate the amplitude data and error data.

* * * * *